US010991609B2

(12) United States Patent
Zinner et al.

(10) Patent No.: US 10,991,609 B2
(45) Date of Patent: Apr. 27, 2021

(54) METHOD AND SUBSTRATE HOLDER FOR THE CONTROLLED BONDING OF SUBSTRATES

(71) Applicant: EV GROUP E. THALLNER GMBH, St. Florian am Inn (AT)

(72) Inventors: Dominik Zinner, Zell an der Pram (AT); Thomas Wagenleitner, Aurolzmunster (AT); Jurgen Markus Suss, Rainbach (AT); Jurgen Mallinger, Senftenbach (AT); Thomas Plach, Stadl-Paura (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 98 days.

(21) Appl. No.: 16/321,496

(22) PCT Filed: Aug. 12, 2016

(86) PCT No.: PCT/EP2016/069307
§ 371 (c)(1),
(2) Date: Jan. 29, 2019

(87) PCT Pub. No.: WO2018/028801
PCT Pub. Date: Feb. 15, 2018

(65) Prior Publication Data
US 2020/0027768 A1 Jan. 23, 2020

(51) Int. Cl.
*H01L 21/68* (2006.01)
*H01L 21/67* (2006.01)
*H01L 21/683* (2006.01)

(52) U.S. Cl.
CPC ........ *H01L 21/68* (2013.01); *H01L 21/67092* (2013.01); *H01L 21/67288* (2013.01); *H01L 21/6833* (2013.01); *H01L 21/6838* (2013.01)

(58) Field of Classification Search
CPC ............... H01L 21/68; H01L 21/67092; H01L 21/67288; H01L 21/6833; H01L 21/6838
See application file for complete search history.

(56) References Cited

U.S. PATENT DOCUMENTS

| 4,752,180 | A | 6/1988 | Yoshikawa |
| 5,129,827 | A * | 7/1992 | Hoshi ............... H01L 21/67092 438/457 |
| 6,214,692 | B1 | 4/2001 | Thallner |
| 7,682,933 | B1 | 3/2010 | Loomis |
| 9,061,388 | B2 | 6/2015 | Tiefenbock |
| 9,312,161 | B2 | 4/2016 | Wimplinger et al. |
| 10,483,212 | B2 | 11/2019 | Sugaya et al. |

(Continued)

FOREIGN PATENT DOCUMENTS

| EP | 2655006 B1 | 1/2015 |
| EP | 2656378 B1 | 3/2015 |
| JP | H07-66092 B2 | 7/1995 |

(Continued)

OTHER PUBLICATIONS

International Search Report from corresponding International Patent Application No. PCT/EP16/69307, dated Jan. 13, 2017.

*Primary Examiner* — Jeffry H Aftergut
(74) *Attorney, Agent, or Firm* — Kusner & Jaffe

(57) ABSTRACT

A method and a device for bonding a first substrate with a second substrate at mutually facing contact faces of the substrates.

16 Claims, 8 Drawing Sheets

(56) References Cited

U.S. PATENT DOCUMENTS

2002/0034859 A1* 3/2002 Takisawa .......... H01L 21/67092
                                                    438/455
2016/0155721 A1* 6/2016 Sugakawa ......... H01L 21/67248
                                                    438/5

FOREIGN PATENT DOCUMENTS

| JP | 07-066093 | | 3/2007 |
| JP | 2012186245 | | 9/2012 |
| JP | 2015-084369 A | * | 4/2015 |
| JP | 2016-39254 A | | 3/2016 |
| KR | 10-1521971 | | 5/2015 |
| WO | WO 2014/191033 A1 | | 12/2014 |
| WO | WO 2014/202106 A1 | | 12/2014 |
| WO | WO 2015/082020 A1 | | 6/2015 |
| WO | WO 2016/093284 | | 6/2016 |
| WO | WO 2016/093284 A1 | | 6/2016 |
| WO | WO 2017/162272 A1 | | 9/2017 |

* cited by examiner

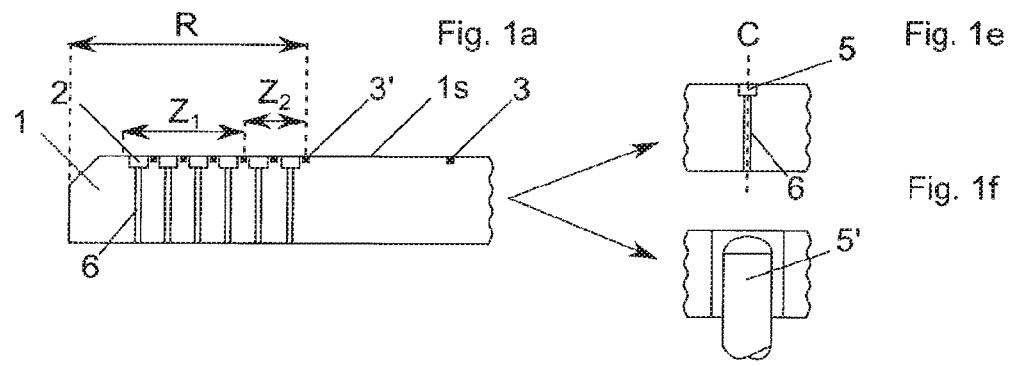
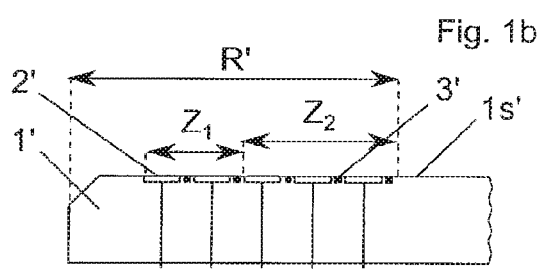
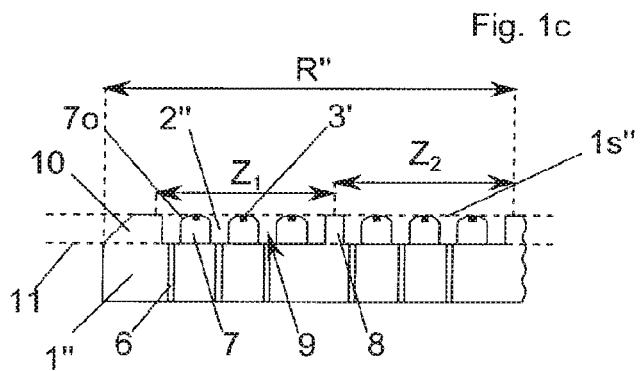
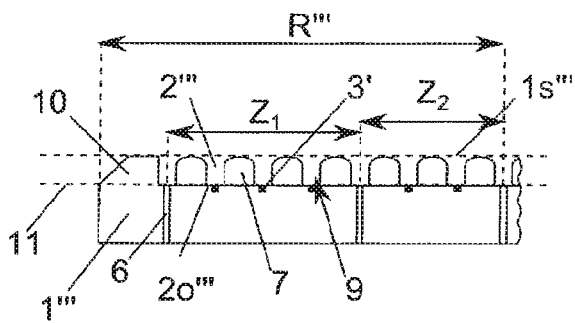

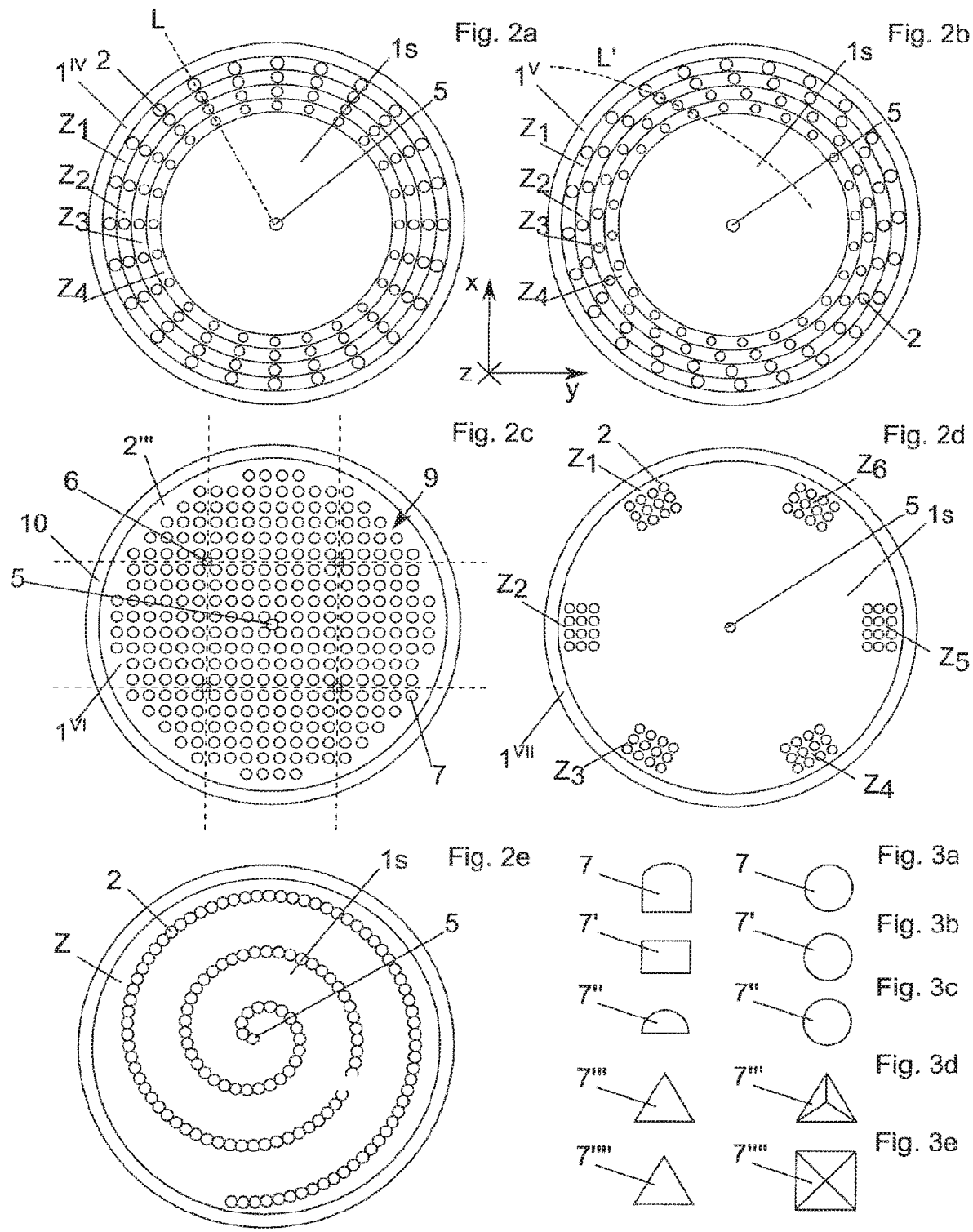

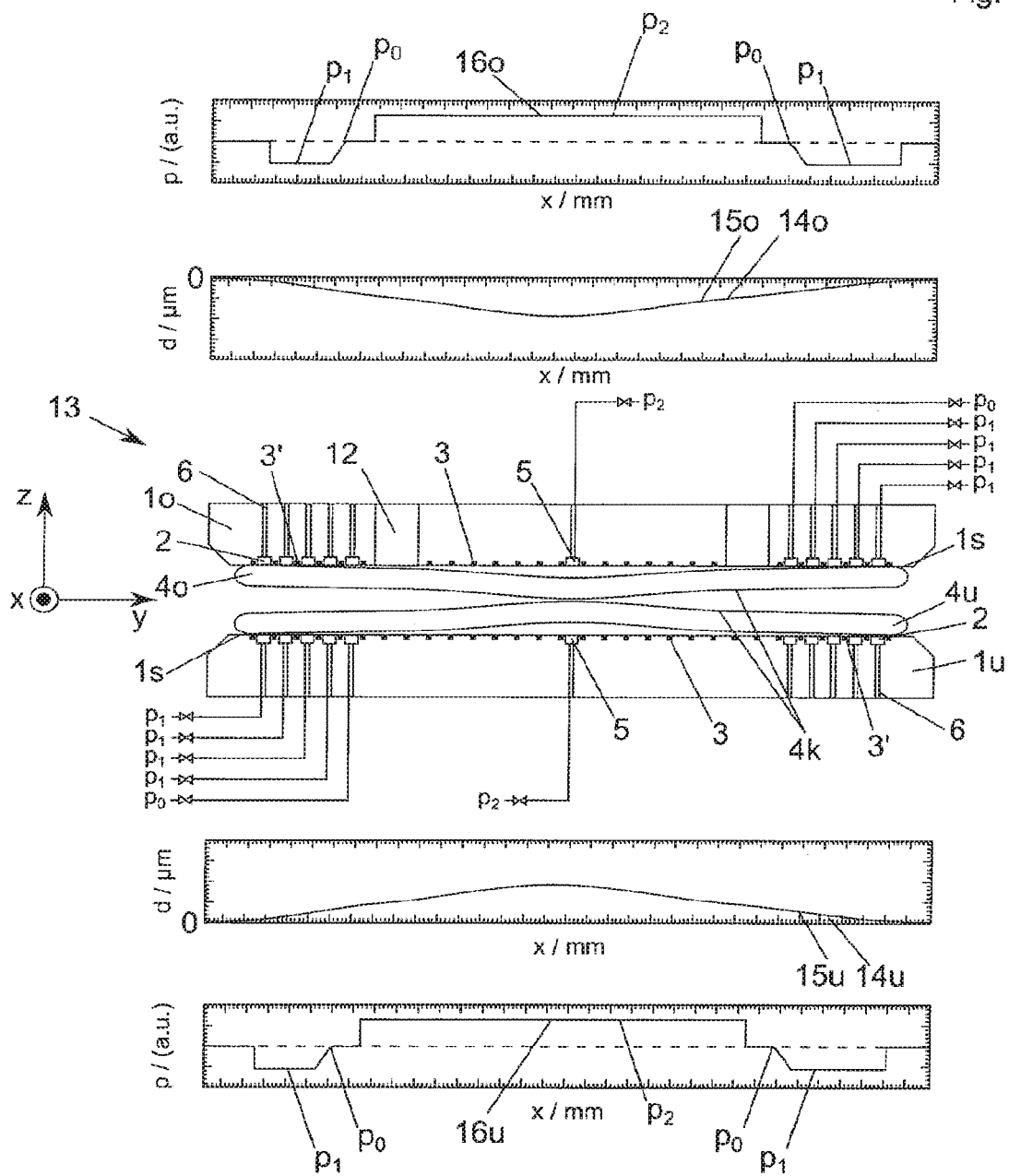

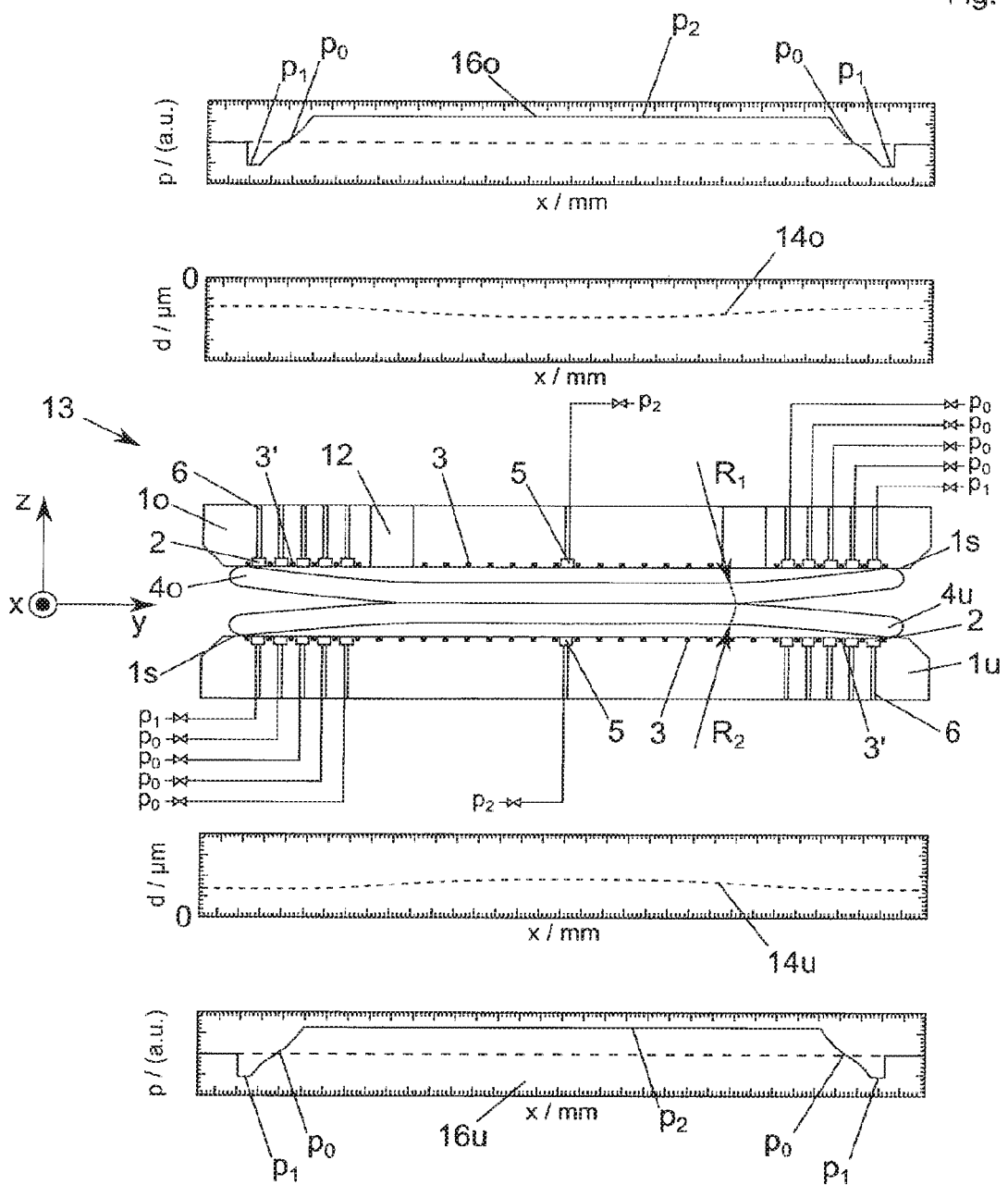

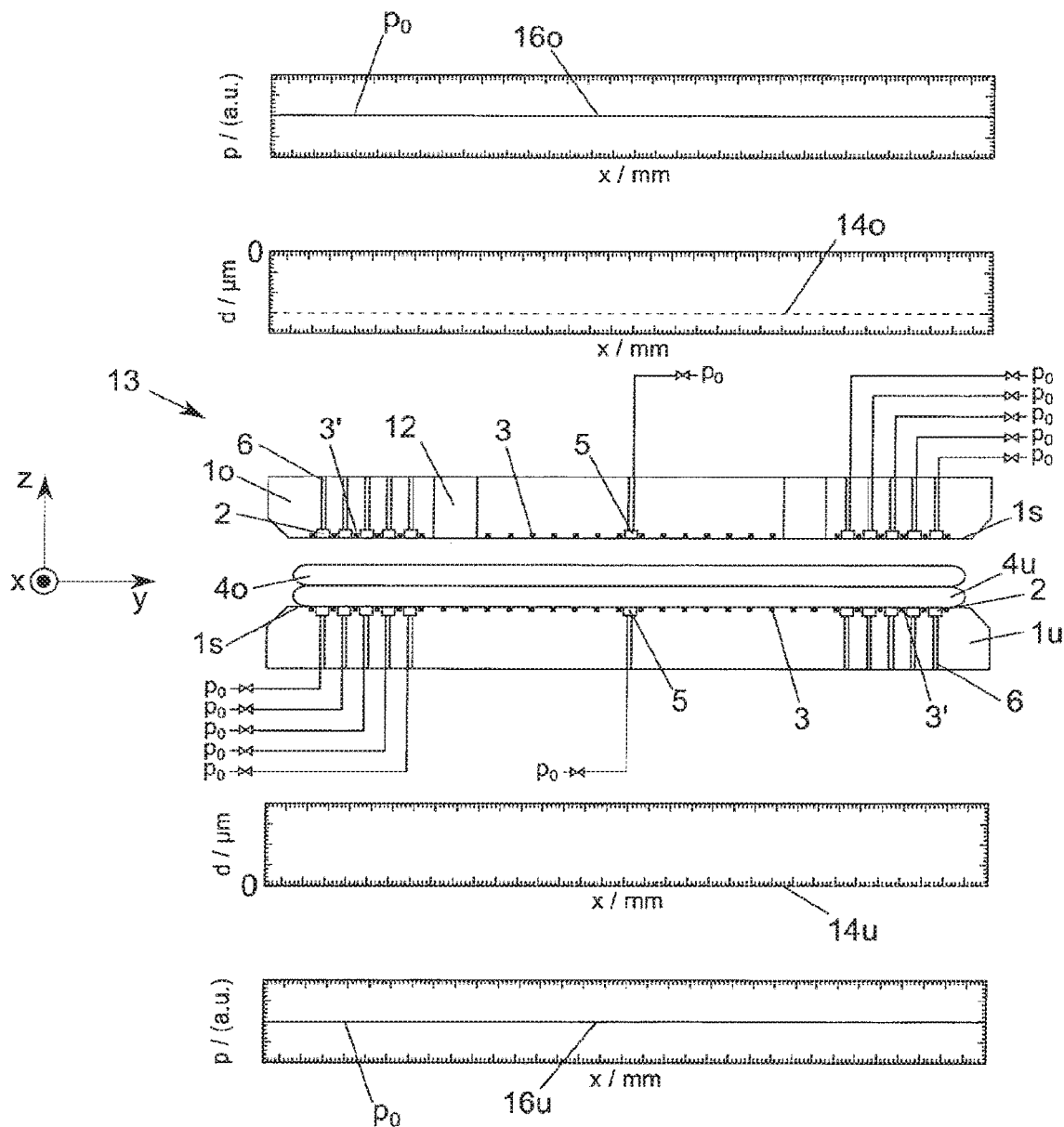

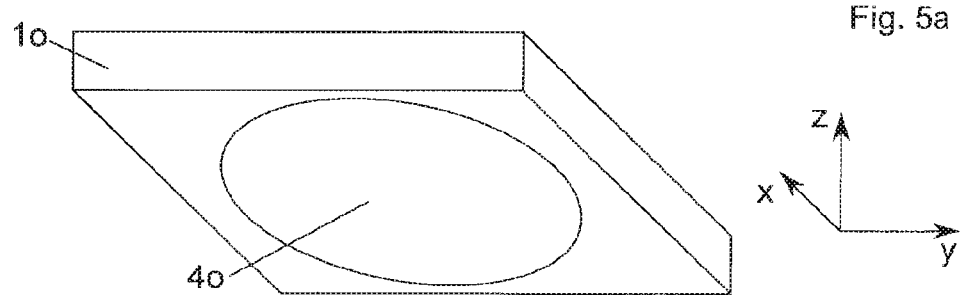
Fig. 5a
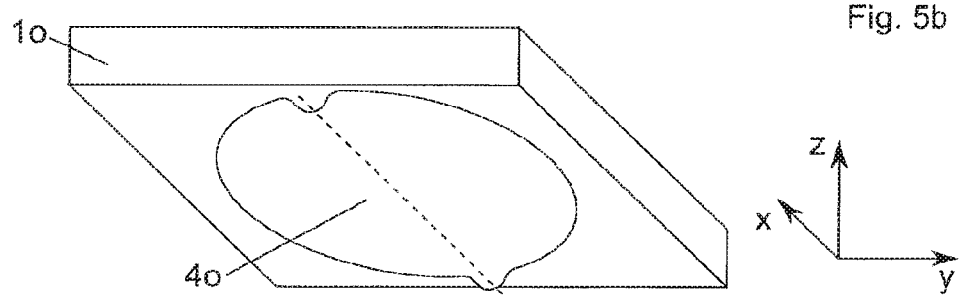
Fig. 5b
Fig. 6a
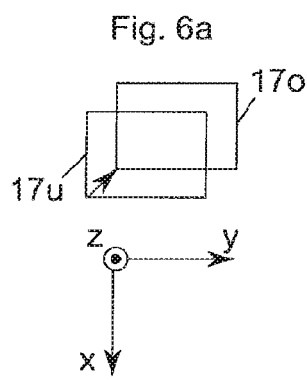
Fig. 6b
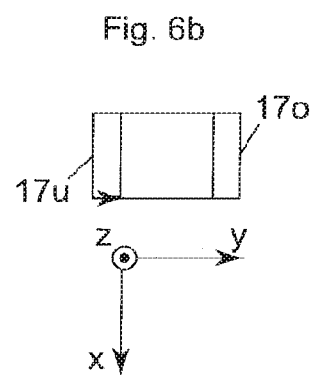
Fig. 7a
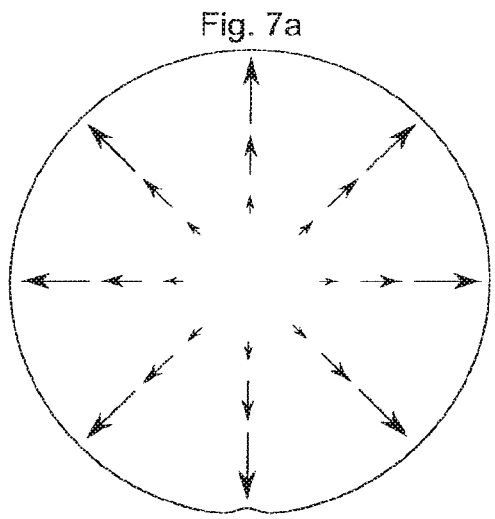
Fig. 7b
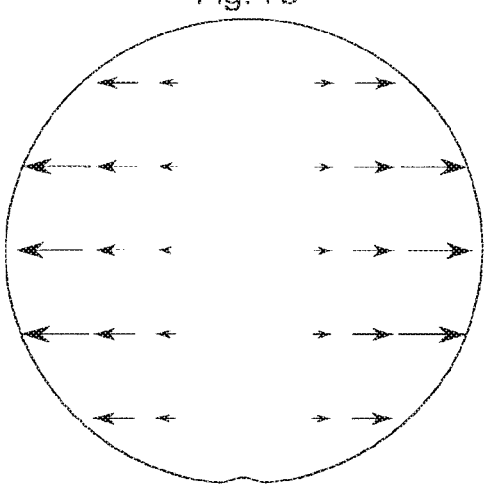

METHOD AND SUBSTRATE HOLDER FOR THE CONTROLLED BONDING OF SUBSTRATES

FIELD OF THE INVENTION

The invention relates to a method for bonding a first substrate with a second substrate and a corresponding device.

BACKGROUND OF THE INVENTION

Substrates have been joined together by so-called bonding processes for many years in the semiconductor industry. Before the joining, these substrates must be aligned with one another as accurately as possible, wherein divergences in the nanometer range occurring in the meantime play a part. The alignment of the substrates usually takes place by means of alignment marks. Apart from the alignment marks, other, in particular functional elements are also present on the substrates, which also have to be aligned with one another during the bonding process. This alignment accuracy between the individual functional elements is required for the entire substrate surface. Thus, for example, it is not sufficient for the alignment accuracy to be very good in the centre of the substrates, but to diminish towards the edge.

In the prior art, there are a number of methods and systems, with the aid of which an attempt can be made to exert an influence on the bonding process, such as for example publications EP2656378B1, WO201419-1033A1 or PCT/EP2016056249.

One of the greatest challenges in bonding is in the bonding process itself, i.e. during the bond initiation up to the complete contacting of the contact faces of the substrates. The alignment of the two substrates with respect to one another can still change decisively here compared to the previous alignment. If the two substrate surfaces are first joined together, a separation is theoretically again possible, but is associated with high costs, low throughput and susceptibility to errors.

SUMMARY OF THE INVENTION

The problem addressed by the present invention is to provide a device and a method for bonding two substrates, with which the bonding accuracy, in particular over the entire area, is increased.

The present problem is solved with the features of the independent claims. Advantageous developments of the invention are given in the sub-claims. All combinations of at least two features given in the description, in the claims and/or the drawings also fall within the scope of the invention. In stated value ranges, values lying inside the stated limits are also deemed to be disclosed as limiting values and can be claimed in any combination.

According to the invention, a method is proposed for bonding a first substrate with a second substrate at mutually facing contact faces of the substrates with the following steps, in particular the following sequence:
  holding of the first substrate to a first holding surface of a first holding device and holding of the second substrate to a second holding surface of a second holding device,
  fixing of the substrates at the holding surfaces by fixing elements,
  curvature of at least one of the contact faces before the contacting of the contact faces, wherein,
  after the contacting, only those fixing elements are at first switched off which are arranged uniaxially along a single contacting axis, and the remaining fixing elements remain switched on, so that the substrates are first joined together only uniaxially along the contacting axis,
  wherein the remaining fixing elements are thereafter switched off, so that the substrates are joined together over the whole area.

The method according to the invention advantageously permits a reduction in the distortion during the bonding of the substrates, since bonding at first takes place only along the contacting axis, so that only uniaxial distortions can occur.

In a preferred embodiment, provision is made such that the fixing elements are arranged in a grid-like form, wherein the distances between adjacent fixing elements are preferably constant. The fixing elements can advantageously be distributed more uniformly, so that better monitoring of the bonding along the contacting axis can be achieved.

In a further improvement, the fixing elements are constituted rectangular and/or have the shape of structures to be brought into congruence with one another, said structures being present on the surfaces of the substrates. The fixing elements can be constituted in particular circular ring-shaped.

In another preferred embodiment, provision is made such that the fixing elements are switched off sequentially, preferably from the inside outwards and/or at an identical time interval. Advantageously, the release of the substrate from the holding device can thus be particularly well controlled, so that a particularly good reduction of distortions is possible.

In a preferred alternative embodiment, provision is made such that the fixing elements along a curve, in particular a straight line, are switched off simultaneously. Advantageously, a particularly uniform release of the substrate is thus possible, as a result of which the distortions along the curve are formed uniformly.

According to another preferred embodiment, provision is made such that the curvature is generated by a deformation element constituted in an elongated manner along the contacting axis and/or a plurality of deformation elements arranged along the contacting axis. Advantageously, it is thus possible that the deformation element or the deformation elements adapt to the contacting axis. Particularly advantageously, the distortions can thus be formed uniformly along the contacting axis. In particular, the use of a single deformation element, which can in particular contact the centre of the substrate, is conceivable.

In another preferred embodiment, provision is made such that the curvature takes place in a convex manner as viewed from the opposite substrate. Advantageously, it is possible as a result of the convex curvature for the substrate to be curved in the direction of the opposite substrate. A particularly precise contacting of the substrates is thus possible, so that a considerable reduction in the distortions or a concentration of the distortions along the contacting axis is also possible.

In another preferred embodiment, provision is made such that the curvatures of both substrates take place mirror-inverted with respect to one another. Mirror-inverted means the reflection in respect of the plane lying between the substrates. The plane is in particular parallel with the bonding plane arising after the bond. A particularly precise contacting is advantageously possible if the two substrates are curved mirror-inverted with respect to one another, because the substrates can then make contact precisely at the respective raised points.

In another preferred embodiment, provision is made such that the contacting axis runs through the centre of one of the substrates, preferably through the centres of both substrates. Advantageously, this embodiment makes it possible for the contacting axis to run centrally through the substrates. This advantageously enables a central course of the distortions, so that the distortions can be constituted uniformly.

In another preferred embodiment, provision is made such that the contacting of the substrates is initiated in the centres of the substrates, wherein the contacting of the substrates preferably takes place along the contacting axis completely up to the outer edges of the substrates. As a result of the fact that the contacting takes place along the contacting axis completely up to the outer edges of the substrates, a uniaxial contacting can take place along the entire width of the substrates. The distortions can thus be formed as precisely as possible along the contacting axis.

In another preferred embodiment, provision is made such that the fixing of the substrates takes place solely at their outer edges. Advantageously, a fixing in the centre of the substrates is thus not required, as a result of which the fixing can be simplified considerably. Moreover, the release is thus facilitated, because the release in the centre does not have to be controlled or only very slightly.

In another preferred embodiment, provision is made such that the fixing elements are grouped into a plurality of zones, wherein the zones can be switched on and off separately and/or are arranged at the outer edges of the substrates, wherein the zones are preferably arranged at the outer edges of the substrates distributed with a uniform spacing from one another. As a result of the zones, larger areas can advantageously be switched on and off. It is thus possible to simplify the control of the release or of the fixing elements. When the zones are arranged in the outer edges of the substrates in particular distributed with uniform spacing from one another, the release can be influenced in a particularly favourable manner by the appropriate selection of the zones to be switched off. In particular, if zones are switched off that lie opposite with respect to the centres of the substrates, a uniaxial release of the substrates can take place.

Furthermore, a device is provided according to the invention for bonding a first substrate with a second substrate at mutually facing contact faces of the substrates comprising:
  a first holding device for holding the first substrate to a first holding surface and a second holding device for holding the second substrate to a second holding surface
  curvature means for the curvature of at least one of the contact faces before contacting of the contact faces, wherein
  the device comprises control means, so that after the contacting only those fixing elements are first switched off which are arranged uniaxially along a single contacting axis, and the remaining fixing elements can remain switched on, so that the substrates can first be joined together solely uniaxially along the contacting axis,
  wherein the remaining fixing elements can thereafter be switched off so that the substrates can be joined together over the whole area.

The idea underlying the invention is to switch off the fixing elements, in particular suction elements, in such a way that the substrate is at first released only along a single axis or a single direction. The substrate thus also becomes deformed only along this axis or this direction. The bonding wave assumes an essentially rectangular shape. The substrates at first bond only along this axis or this direction, in particular from the centre up to the outer edges of the substrates. Advantageously, the distortions of the substrates can thus be minimised, as a result of which the bonding accuracy can be improved considerably.

Features, embodiments, definitions and aspects which apply to the method are also intended to apply to the device and vice versa.

In a preferred embodiment and/or as an independent invention, zones with fixing elements can be switched on and off in such a way that the deflection of the substrate or the substrates can be influenced in a targeted manner. The zones are arranged in particular solely at the outer edge of the substrates.

In particular, the deflection is influenced by the switching of the zones in such a way that a deviation from the symmetrical deflection of a substrate results. In particular, the symmetry of the deflection diminishes. It is conceivable that, when a plurality of zones are switched off, deflections of the substrate take place which have a
  linear or uniaxial
  n-shaped, in particular
  triangular
  rectangular
  pentagonal
  hexagonal
  heptagonal
  octagonal
star-shaped symmetry. The symmetry of the deflection can be adjusted such that the minimum possible "run-out" occurs as the bonding wave advances.

Furthermore, the idea underlying the invention is in particular that at least one of the substrates is curved, in particular uniaxially, before the contacting or the bonding and the curvature of at least one of the two substrates is changed during the bonding, in particular during the course of a bonding wave, preferably in fusion bonding, by controlling the curvature. The curvature of the other (preferably upper) substrate is preferably also changed, but in particular without precise control of the change in curvature, but preferably by automatic contacting of this substrate. The automatic contacting takes place in particular by the gravitation acting on the substrate and/or other forces of attraction between the substrates. The control of the change in curvature of the one (in particular lower) substrate takes place in particular in a similar way to the change in curvature of the other (in particular upper) substrate, preferably as a function (preferably by measurement and control) of its change in curvature. It is also conceivable for one of the two substrates, in particular the lower substrate, not to have a mirror-inverted curvature with respect to the other, in particular upper, substrate, in particular even to be fixed completely flat.

Change in curvature is understood in particular to mean a state diverging from an initial state (in particular the curvature adjusted before the contacting) of the substrates. According to the invention, the bonding is controlled, after contacting of the contact faces, in particular by a monitored control of a fixing of the substrates. Corresponding fixing means are in particular provided according to the device.

A further, in particular independent, aspect of the present invention includes the use of, in particular individually switchable, fixing means, with the aid of which an advancing bonding wave between the contact faces can be controlled or regulated in a monitored manner.

Particularly good results are obtained especially when the bonding wave arrives simultaneously at all points of the edge of the substrates. In particular, the fixing and the zone switching are used with which this result is achieved.

A plurality of switchable fixing means are preferably switched off simultaneously along a predetermined curve, in particular a straight line, so that the substrate is curved uniaxially.

The curvature can be generated by gravitation and/or at least one deformation element.

A further, in particular independent idea according to the invention, or one that can be combined with the aforementioned idea, includes the use of at least one deformation element as a curvature means and/or curvature changing means, which is constituted in particular as a gas outlet opening. Mechanical contact with the substrate is thus avoided. The monitoring of the curvature takes place more precisely by a combination of the aforementioned features.

Since, according to the invention, the substrate is to be curved uniaxially, the deformation element can also be formed in an elongated manner according to the invention. The use of a deformation means which can load the substrate in a punctiform manner is however also conceivable. A plurality of deformation means, which are incorporated in the sample holder along a curve, in particular a straight line, represent a further possibility.

In particular, the invention describes a method and a device, with the aid of which two substrates aligned with one another can be bonded together in the optimum manner. The idea is primarily based on the notion of monitoring, controlling or regulating the advancing bonding wave by targeted monitoring, control or regulation of the curvature, fixing and/or release of at least one of the two substrates, in such a way that there is an optimum, sequential contacting of the two substrates along the contact faces, in particular advancing along one direction. In contrast with the prior art, the fixing means are thus switched in such a way that a uniaxial curvature of the substrates results. Optimum contacting is understood in particular to mean that the "run-out" error at every point of the contact interface between the two substrates is minimal or, in the optimum case, even disappears.

According to an embodiment, a fixing of the substrates is provided by a plurality of fixing means, in particular divided up into zones.

According to a further embodiment, the curvature of at least one of the substrates is provided by means of excess pressure.

In the initial state, the substrates, especially at a contact face, are usually more or less flat, apart from any structures projecting above the contact face (microchips, functional components) and substrate tolerances such as bending and/or thickness variations. In the initial state, however, the substrates in most cases have a curvature differing from zero. For a 300 mm wafer, curvatures of less than 100 μm are common. From the mathematical standpoint, a curvature can be regarded as a measure of the local deviation of a curve from its plane state. In the specific case, substrates are considered whose thicknesses are small compared to the diameter. To a good approximation, therefore, one can speak of the curvature of a plane. In the case of a plane, the initially mentioned plane state is the tangential plane of the curve at the point at which the curvature is observed. Generally speaking, a body, in the special case the substrate, does not have a homogeneous curvature, so that the curvature is an explicit function of the location. Thus, it may for example be the case that a non-plane substrate has a concave curvature in the centre, but a convex curvature at other points. According to the invention, curvature or change in curvature—unless described otherwise—is understood to mean a macroscopic curvature or change in curvature, i.e. related to the entire substrate or the contact face.

A uniaxial curvature is understood to mean a curvature which curves the substrate only along one dimension or axis. Simplified, in particular uniaxial, expansion and stress states (stress states in the normal direction of the substrate are disregarded) correspondingly result therefrom. Especially in the case of rectangular structures on the substrates, uniaxial expansion states have an extremely favourable effect on the reduction of the "run-out" error, since the "run-out" error now only has to be corrected along one dimension.

According to the invention, convex curvatures are preferred, in each case as viewed from the opposite substrate. Still more preferably, the curvatures of the two substrates run mirror-inverted with respect to one another.

Another possible way of indicating the curvature at a point includes indicating a radius of curvature. The radius of curvature is the radius of a circle adapted to the shape of the surface and containing the surface point in question.

An, in particular, independent core idea for most of the embodiments according to the invention thus is that the radii of curvature of the two substrates to be bonded together are the same, or at least diverge only marginally from one another, at least in the contacting region of the substrates, i.e. at a bonding front of the bonding wave or at the bonding line. The difference between the two radii of curvature at the bonding front/bonding line of the substrates is less than 10 m, preferably less than 1 m, more preferably less than 1 cm, most preferably less than 1 mm, with utmost preference less than 0.01 mm, most preferably of all less than 1 μm. Generally speaking, all embodiments according to the invention that minimise radii of curvature $R1$, $R2$ are advantageous.

A further important core idea for the aforementioned embodiments according to the invention includes the fact that switching-off of the fixing means takes place along an, in particular, linear line, so that a generally multiaxial stress or expansion state of the substrate transforms into a uniaxial stress or expansion state. As a result of the conversion of a multiaxial into a uniaxial stress or expansion state, the run-out now has to be corrected in particular only for one dimension.

The invention relates in particular to a method and a system with the aid of which it is made possible to bond two substrates together in such a way that their local alignment errors, which are referred to as "run-out" errors, are minimal. The different run-out errors are described and referenced comprehensively in WO2014191033A1.

In particular, the invention is furthermore based on the idea of controlling the curvatures/curvature changes of the two substrates to be bonded together in particular by a fixing that can be controlled in particular over wide surface areas, in such a way that the influencing factors on the forming bonding wave are selected such that the two substrates are not displaced locally, i.e. remain correctly aligned, with respect to one another during the bonding. Furthermore, the invention describes an article, comprising two substrates bonded together with a "run-out" error reduced according to the invention.

A characteristic process according to the invention during bonding, in particular permanent bonding, preferably fusion bonding, is the most curve-shaped possible, in particular linear, contacting of the two contact faces of the substrates. The contacting line or the contacting axis will preferably meet the centre of at least one of the substrates. According to the invention, the distance between the contacting line or the contacting axis and the centre of the substrate or of the substrates is in particular less than 100 mm, preferably less than 10 mm, more preferably less than 1 mm, most preferably less than 0.1 mm, with utmost preference less than 0.01 mm. In the rest of the description, contacting should as a rule be understood to mean linear contacting. Line is preferably understood in the subsequent sense to mean an arbitrary uni-dimensional contour.

In order to ensure an initiation of the, in particular, linear contacting, a holding device (substrate holder) provided with a central hole and a pin mobile therein in a translational manner as a curvature means and/or curvature changing means is provided according to an embodiment of the invention. The use of a nozzle as a curvature means and/or curvature changing means, which uses a fluid, preferably a gas, instead of the pin for the, in particular, direct fluid pressurization of the substrate (fluid pressurization means), would also be conceivable. Furthermore, the use of such elements can even be completely dispensed with, if devices are provided which can cause the two substrates to approach one another by a translational movement, with the further provision that both substrates have an impressed curvature in the direction of the other substrate, in particular by reason of gravitation and/or preloading. The substrates automatically make contact during the translational approach, with a sufficiently small spacing with respect to the corresponding second substrate.

According to an embodiment of the invention, the fixing elements are provided vacuum holes, one or more circular vacuum lips or comparable vacuum elements, with the aid of which the wafer can be fixed. The use of a plurality of electrostatic fixing elements (fixing means) is also conceivable. The pin in the central hole or a line from which an excess pressure can be generated between the substrate holder and the substrate by an introduced gas are used for the controllable deflection of the fixed substrate (curvature means and/or curvature changing means).

After the contacting of the centres of the two substrates has taken place, the fixing means of the holding devices are in particular controlled in such a way that a monitored deformation/curvature change of at least one of the substrates takes place. According to the invention, the switching-off of the fixing elements takes place along an, in particular, straight line, so that a uniaxial stress or expansion state arises. An upper substrate is pulled down in a controlled manner on the one hand due to the force of gravity and on the other hand due to a bonding force acting along the bonding wave and between the substrates. The upper substrate is thus joined with the lower substrate from the centre along the line defined by the switched-off fixing means. A formation of a generally non-radially symmetrical bonding wave according to the invention thus arises, which starts in particular from the centre. During the bonding process, the two substrates press the gas, in particular air, present between the substrates ahead of the bonding wave and thus ensure a bonding interface without gas inclusions. An upper substrate then lies, insofar as it is allowed to drop completely, virtually on a kind of gas cushion. From a defined point in time, all the fixing elements of the substrate holder can be switched off, so that the upper substrate is left to itself under the influence of the force of gravity and/or the forces of attraction between the substrates. At this time, the change in curvature of the upper substrate is no longer controlled or regulated, but continues to proceed in a monitored manner, since the boundary conditions are known or have been determined empirically. The change in curvature of the lower substrate is controlled or regulated on the basis of this monitored change in curvature and advancing of the bonding wave. The embodiment preferred according to the invention does not however include the dropping of the upper substrate, but rather in a complete monitoring of the two substrates until the bonding wave has propagated at least over more than 10%, preferably more than 20%, more preferably more than 30%, most preferably more than 50%, with ultimate preference more than 75% of the area of the substrate.

From the aforementioned point in time, at which all the fixing elements of the upper holding device have been switched off, no additional fixing is in particular required. Apart from the fixing at the bond initiation point, the upper substrate can thus move freely and also become distorted. As a result of the bonding wave advancing according to the invention, the stress states arising at the bonding wave front and the prevailing geometrical boundary conditions, each circle segment, infinitesimally small compared to its radial thickness, is subject to a distortion. However, since the substrates represent rigid bodies, the distortions add up as a function of the distance from the centre. This leads to "run-out" errors, which are eliminated by the method according to the invention and the device according to the invention. It is also conceivable for the upper substrate to be held fixed during the entire time segment in which the bonding wave is running and for an advance of the bonding wave to be able to progress by successive switching-off of the fixing elements, in particular starting with the fixing elements inside the substrate holder. An advance of the bonding wave can in particular also be promoted by the fact that a relative approach of the two substrate holders with respect to one another takes place during the advance of the bonding wave.

The distance between the substrates before the contacting lies between 0 and 10 mm, preferably between 0 and 1000 µm, still more preferably between 0 and 500 µm, with utmost preference between 0 and 100 µm.

In a further embodiment according to the invention, the upper substrate in particular is fixed only at a finite number of positions by fixing elements according to the invention from zones, so that a deflection with a low degree of symmetry and deviating markedly from the radial symmetry results in particular due to gravitation and/or a deformation element. In this case, the distance is understood to mean the smallest possible distance between the substrates.

The invention thus relates in particular to a method and a device for reducing or even completely preventing the "run-out" error between two bonded substrates during bonding, in particular by thermodynamic and/or mechanical compensation mechanisms.

Furthermore, the invention relates to a corresponding article, which is produced with the device according to the invention and the method according to the invention.

Holding Device/Substrate Holder

The substrate holder according to the invention comprises fixing means, in particular a plurality of fixing elements. The fixing elements can be grouped into zones. A grouping of the fixing elements into zones performs either a geometrical, optical task, but preferably a functional task. A functional task would for example be understood to mean that all the fixing elements of a zone can be switched simultaneously. It is also conceivable that all the fixing elements in a zone can be switched individually. A plurality of fixing elements can thus be triggered simultaneously within the zone for the fixing or the release of the substrate or they can be triggered individually, but they produce a very individual deformation property of the substrate in their zone.

The zones can in particular have the following geometries:
- single-surface,
- circle segment,
- tiled, in particular as a triangle, rectangle or hexagon,
- circular ring segment.

In particular, areas without fixing elements can also be present between the zones. The spacing between such zones is in particular less than 150 mm, preferably less than 50 mm, more preferably less than 20 mm, most preferably less than 10 mm, with utmost preference less than 5 mm. If the zones are configured as circle segments, the spacing would then be the distance between the inner circular ring of an outer circle segment and the outer circular ring of an inner circle segment.

Circular ring segments which lie closer to the centre are preferably constituted smaller than circular ring segments at the edge.

The number of fixing elements per zone is arbitrary. In particular, more than 1 fixing element, preferably more than 10, more preferably more than 50, still more preferably more than 100, most preferably more than 200, with utmost preference more than 500 are located in a zone.

According to an advantageous embodiment of the invention, the first holding device and/or the second holding device comprise fixing means arranged in particular in a ring-shaped, preferably a circular ring-shaped manner at the periphery of holding surfaces of the first holding device and/or of the second holding device in order to hold the substrates, in particular solely in the region of side edges of the substrates.

The fixing means are constituted as in particular separately controllable fixing elements divided up into zones, arranged preferably concentrically, in particular distributed uniformly at the holding surfaces. The fixing means are preferably arranged, in particular exclusively, in an edge region of the holding surface. The edge region extends in particular up to half the radius, preferably up to a quarter of the radius, of the holding surface.

In a radially symmetrical arrangement of the fixing elements in a zone, the number of the fixing elements per cross-section can also be considered. The number of fixing elements in the cross-section is less than 20, preferably less than 10, more preferably less than 5, most preferably less than 3, with utmost preference 1.

The fixing elements can be subjected to an underpressure for the fixing, and can also be subjected to an excess pressure for the release of the substrate.

In a first embodiment according to the invention, the fixing elements comprise simple holes produced in particular by drilling or spark erosion. In a special embodiment, the fixing elements are ring-shaped, in particular circular ring-shaped slots produced in particular by a milling process. In a development, the fixing elements can be provided with vacuum lips. If the fixing elements are provided with vacuum elements, they can thus generate a pressure of less than 200 mbar, preferably less than 100 mbar, still more preferably 50 mbar, most preferably less than 10 mbar, with utmost preference less than 1 mbar.

Apart from the control of the pressure, the mass flow can also be controlled by the vacuum elements. The mass flow is the mass that passes through a cross-section per unit of time. The mass is composed of the individual masses of the molecules and atoms which are sucked and/or pumped by the vacuum elements. The mass flow for an individual vacuum element lies between 0 kg/s and 1 kg/s, preferably between 0 kg/s and 0.5 kg/s, still more preferably between 0 kg/s and 0.1 kg/s, most preferably between 0 kg/s and 0.01 kg/s, with utmost preference between 0 kg/s and 0.001 kg/s.

In a second embodiment according to the invention, the fixing elements comprise conductive plates, which are used as an electrostatic fixing. The conductive plates can be connected unipolar, but preferably bipolar. In the case of a bipolar circuit, two plates are placed at reciprocal potential. The substrate holder according to the invention then acts in its zones as an electrostatic substrate holder with a highly resolved electrostatic fixing property dependent on the number of plates.

The greater the number of fixing elements per unit area, the better the control of the fixing property of the substrate holder for the substrate.

The first holding surface and/or the second holding surface are advantageously formed from elevations, forming in particular a first holding plane of the first holding surface and a second holding plane of the second holding surface.

In particular, spirally running tracks come into question as elevations.

According to two further embodiments, the holding devices with elevations, in particular stud substrate holders, are described. Such a substrate holder is understood to mean a substrate holder which comprises a plurality of, in particular symmetrically arranged, pillars. These pillars are in particular constituted as studs. The studs can have any shapes. In particular, studs are provided in the shape of:
- pyramids, in particular three-sided or four-sided pyramids,
- cylinders, in particular with a flat or rounded head,
- cuboids,
- cones,
- spherical shells.

Spherical-shell studs, conical studs and cylindrical studs are expensive to produce, whereas pyramid-shaped or cuboid studs can be produced relatively simply by etching and/or milling processes and are therefore preferred according to the invention.

The mentioned stud substrate sample holders can be terminated at their periphery by an edge element, so that the spatial regions between the studs can be interpreted as recesses. It is however also possible for the studs to represent the individual elevations with respect to the stud plane, on which all the studs are present.

In a third preferred embodiment according to the invention, the substrate holder is constituted as a stud substrate holder with webs. The individual zones are interrupted here by webs. At least one line ends inside each zone, which line permits an evacuation of the space between the studs. As a result of the use of a plurality of, in particular individually controllable, channels, a locally dependent evacuation of the space of differing intensity is possible.

In a fourth, still more preferred embodiment, the substrate holder is constituted as a complete stud substrate holder, i.e. without webs.

The width or diameter of the elevations, in particular studs, is in particular less than 5 mm, preferably less than 1 mm, still more preferably less than 500 µm, most preferably less than 200 µm.

The height of the elevations, in particular studs, is in particular less than 2 mm, preferably less than 1 mm, still more preferably less than 500 µm, most preferably less than 200 µm.

In particular, the ratio between the width or the diameter of the elevations and the height of the elevations is greater than 0.01, preferably greater than 1, still more preferably greater than 2, most preferably greater than 10, with utmost preference greater than 20.

All the stated embodiments according to the invention can also be combined arbitrarily with one another. Thus, it is conceivable for a first zone to comprise electrostatically operating fixing elements, and for a second zone to comprise vacuum fixings.

A substrate holder according to the invention can in particular comprise holes, referred to in the rest of the publication is measurement holes, which permit a view of the fixed substrate surface from the rear side of the substrate holder. A measurement of the fixed substrate surface in this region is thus enabled. The measurement holes can also be closed by means of a cover. In a very particularly preferred embodiment, the measurement holes can be fully automatically opened or closed with the cover.

According to an advantageous embodiment of the invention, the holding device comprises curvature measuring means for measuring the curvature.

Alternatively or in addition, a substrate holder according to the invention can comprise sensors, with the aid of which physical and/or chemical properties between the fixed substrate and the substrate sample holder can be measured. The sensors are preferably
temperature sensors and/or
pressure sensors and/or
distance sensors.

The particularly preferred distance sensors can be used as curvature measuring means, in that the curvature of the substrate is determined from the distance between the substrate and the holding device, in particular interpreted and/or calculated between pillars.

According to the invention, distance sensors, in particular distributed along the holding surface, are preferably used to enable a better control or even regulation of the curvature and/or change in curvature.

In a particularly preferred embodiment, a plurality of sensors are primarily constituted as distance sensors in order to measure the distance of the substrate with respect to a plane before and/or during the bonding process. The plane is preferably the holding surface and/or the holding surface, in particular a plane formed through the elevations.

It is also conceivable for sensors to be located on different planes. The sensors preferably measure, in particular exclusively, the change in a distance, preferably normal to the contact face, so that the reference to a plane and/or a plurality of planes is irrelevant. In this case, only the relative, in particular locally different, change in distance of the substrate has to be detected.

The measurement of the distance is used primarily for the process control. Through the knowledge of the precise curvature state of the substrate/substrates, the control/regulation of the fixing elements according to the invention for the optimum, in particular gradual, release of the substrate takes place in a particularly efficient manner.

It is also conceivable for several different types of sensor to be incorporated. In a particularly preferred embodiment, sensors for distance and pressure measurement are incorporated in the substrate holder, in particular distributed symmetrically and uniformly. A discrete, but surface-covering distance measurement and pressure measurement is thus possible. The pressure measurement is particularly advantageous if the deformation element is a fluid, in particular a gas or gas mixture, introduced via a line.

Insofar as one or both holding devices are constituted without curvature measuring means and/or without sensors, the adjustment and/or control of the curvatures and/or changes in curvature can take place on the basis of empirically determined parameters.

The first and second substrate holders according to the invention preferably comprise at least one, in particular concentrically designed, deformation element for the curvature/change in curvature of the substrates (curvature means and/or curvature changing means).

According to a first embodiment according to the invention, the curvature element is a pin. This pin has at least one, preferably precisely one degree of freedom in translation along the normal to the holding surface or holding plane. It would also be conceivable for the pin to have degrees of freedom along the holding surface in order to be calibrated in the x- and/or y-direction. The pin can preferably be fixed in the x- and/or y-direction. The pin can apply a force of 0.01N-1000N, preferably 0.1N-500N, most preferably 0.25N-100N, with utmost preference between 0.5-10 N.

In a second embodiment according to the invention, the deformation element for the curvature/change in curvature is a fluid outlet opening, via which a fluid, in particular gas of gas mixture, can be fed between the substrate and the holding surface (fluid pressurization means). In a very preferred embodiment according to the invention, the fluid outlet opening is incorporated in its own partial element, in particular mobile in the x- and/or y-direction, so that an x- and/or y-positioning of the fluid outlet opening can take place. The position of the fluid outlet is thus established exactly, which can also have effects on an optimum bonding result according to the invention. In the simplest case, the fluid outlet opening is an opening which represents the end of a line. In a very particularly preferred embodiment, the fluid outlet opening is a nozzle. The nozzle can preferably be controlled electronically, so that at any time the fluid pressure and/or the fluid speed of the outflowing fluid can be controlled/regulated. The use of a plurality of nozzles is conceivable in order to vary the pressure build-up at several points between the substrate sample holder and the substrate. All comments relating to a nozzle then apply equally to a plurality of nozzles. A pressure of more than 1 mbar, preferably more than 10 mbar, most preferably more than 100 mbar, still more preferably more than 200 mbar, with utmost preference more than 500 mbar can be built up between the substrate and the substrate holder via the fluid outlet opening, in particular a nozzle.

All the substrate holders according to the invention can comprise loading pins. Loading pins are used to load the substrate holder according to the invention with a substrate. The loading pins are passed in particular through holes in the holding device, wherein the holes are preferably constituted sealed with respect to the loading pins.

The loading pins are extended in a first process step. A substrate is placed, in particular fully automatically, on the loading pins in a second process step. The loading pins are retracted and thus bring the substrate into contact with the holding surface in a third process step. The substrate is fixed by means of the fixing elements in a fourth process step. The loading pins are also used for the unloading of a bonded substrate stack. The sequence of the process steps is then correspondingly reversed. The loading pins can in particular represent pressure sinks, insofar as they have not been sealed with respect to the holes in which they move. In this case, the static maintenance of an underpressure via vacuum fixing elements and/or the static maintenance of an excess pressure through a gas outlet opening is not possible. A continuous evacuation via the vacuum fixing elements and/or a continuous excess pressure generation via the gas outlet opening is accordingly disclosed, which is preferably characterised by a stationary, in particular laminar, flow. It is conceivable, however, also to make use of seals, so that a static pressure can be built up without the formation of a flow occurring.

The substrate holder can in principle be produced from any material. One or more of the following materials are particularly preferable:
- metal, in particular
  - pure metal, in particular
    - aluminium
  - alloy, in particular
    - steel, in particular
      - low-alloy steel,
- ceramic, in particular
  - glass ceramic, in particular
    - Zerodur,
  - nitride ceramic, in particular
    - silicon nitride,
  - carbide ceramic, in particular
    - silicon carbide,
- polymers, in particular
  - high-temperature polymers, in particular
    - Teflon,
    - polyether ether ketone (PEEK).

In a very particularly preferred embodiment, a stud substrate sample holder according to the invention is produced using the method from patent specification EP2655006B1. The preferred material is silicon carbide or silicon nitride. The preferred stud structure in this case is a four-sided pyramid.

According to an embodiment according to the invention, the holding device is preferably constituted heatable and/or coolable. In this case, temperature control mechanisms permit a temperature regulation of the substrate between −50° C. and 500° C., preferably between −25° C. and 300° C., most preferably between 0° C. and 200° C., with utmost preference between 10° C. and 100° C.

In a further embodiment according to the invention, the substrate holder is constituted such that the substrate can be deformed, in particular laterally compressed or extended, in a targeted manner by heating and/or cooling means before the contacting, and more precisely by the amount that is required in the subsequent contacting to compensate in the best possible way, in the ideal case completely, for the occurring "run-out" error. Since the fixing of the lower/first substrate in this embodiment does not take place until after the corresponding deformation, no particular importance has to be placed on the thermal expansion coefficients of the lower/first substrate and the lower/first holding device. In the particularly preferred embodiment of a stud substrate holder according to the invention, the substrate can be brought into contact with a heated/cooled gas via the spatial regions between the studs. To maintain the fixing capability of the fixing elements, the pressure of the heated gas must be less than the ambient pressure, which presses the substrate onto the substrate holder in the region of the zones.

Bonder

A device according to the invention comprises two holding devices/substrate holders according to the invention. At least the upper substrate holder preferably comprises measurement holes. The measurement holes are constituted in particular closeable and/or sealed.

The embodiments according to the invention are preferably operated in a defined, in particular controllable, atmosphere, in particular under normal pressure.

All the mentioned embodiments according to the invention can, in a special variant of embodiment, be operated in a low vacuum, more preferably in a high vacuum, still more preferably in an ultrahigh vacuum, in particular at an ambient pressure of less than 100 mbar, preferably less than $10^{-1}$ mbar, more preferably less than $10^{-3}$ mbar, still more preferably less than $10^{-5}$ mbar, with utmost preference less than $10^{-8}$ mbar. The higher the vacuum or the lower the pressure in the surroundings, the more difficult it will be however to fix a substrate with the aid of vacuum holes and to adjust and/or control the curvature of the substrate according to the invention.

Processes

In a first process step according to the invention of a first process according to the invention, a first substrate is loaded onto a first substrate holder and a second substrate is loaded onto a second substrate holder and in particular fixed in a peripheral part. The fixing is in particular carried out in such a way that only a few, in particular less than 10, more preferably less than 5, most preferably 3, with utmost preference 2 zones are switched on. The switched-on zones are in particular distributed symmetrically along a circular ring.

In a second process step according to the invention of a first process according to the invention, the two substrates are aligned with one another. The alignment of the substrates is not described in detail here. In this regard, reference is made to publications U.S. Pat. No. 6,214,692B1, WO2015082020A1, WO2014202106A1. Before the bonding process, the substrates are in particular aligned with one another in order to guarantee congruence (exact alignment, in particular with an accuracy of less than 2 µm, preferably less than 250 nm, still more preferably less than 150 nm, most preferably less than 100 nm, with utmost preference less than 50 nm) of corresponding structures on their surfaces.

In a third optional process step according to the invention of a first process according to the invention, the approach of the two substrates takes place by a relative movement of the two substrate holders towards one another. A well-defined gap is thus produced between the substrate surfaces. It is also conceivable for this gap to be adjusted before or during the alignment process. The gap amounts in particular to less than 1000 µm, preferably less than 500 µm, more preferably less than 250 µm, with utmost preference less than 100 µm.

According to the invention, it is particularly preferable if the radius of curvature of the two substrates, in particular at the bonding front, diverges the one from the other by less than 15%, preferably less than 10%, more preferably less than 5%, still more preferably less than 2%, with utmost preference is equal.

In a fourth process step according to the invention of a first process according to the invention, a curvature of the first and/or the second substrate takes place. At the same time, the curvature of the first and/or second substrate can be measured and monitored with the aid of the sensors. In particular, a desired curvature at the lower and/or upper substrate can automatically be adjusted by means of a control loop. A setpoint value is preset. The control loop then controls the fixing elements and/or the deformation element until such time as the desired curvature profile has been adjusted. It should be mentioned that gravitation acts in one direction and can thus affect the deformation of the substrates differently. Whereas an upper fixed substrate is deformed by gravitation farther in the direction of the desired contact point, gravitation works against the curvature of the lower substrate. The influence of gravitation may however also be negligible. As a result of the use according to the invention of automatically controlled or regulated curvature means or curvature changing means, fixing elements and sensors, the desired curvature profile can be adjusted for each of the two substrates, in particular as part of a control loop. Once the two substrates have approached one another sufficiently closely, the contacting of the two substrates takes place. The contacting can take place either by the constantly increasing curvature and/or by a relative approach of the two substrate holders towards one another. In the bonding process according to the invention, the substrates are not placed flat upon one another, but are first brought into contact with one another at centre M (bond initiation point), whereby one of the two curved substrates is pressed lightly against the second substrate or is correspondingly deformed in the direction of the substrate lying opposite. After release of the deformed (in the direction of the opposite substrate) deflected substrate, a continuous and more uniform, in particular at least partially, preferably predominantly automatic bonding, associated with the least possible force and therefore with the least possible, chiefly horizontal, distortions, takes place along the bonding front as a result of the advance of a bonding wave.

In particular, the zones can be switched on and off in such a way that a deviation from the symmetrical deflection of a substrate results. In particular, the symmetry of the deflection diminishes. It is conceivable that, when a plurality of zones are switched off, deflections of the substrate take place which have a linear or uniaxial
n-shaped, in particular
triangular
rectangular
pentagonal
hexagonal
heptagonal
octagonal
star-shaped symmetry. The symmetry of the deflection can be adjusted such that the minimum possible "run-out" occurs as the bonding wave advances.

In a fifth process step according to the invention of a first process according to the invention, the advance, the monitoring and the control of the bonding wave takes place. Insofar as the bond initiation point is arranged in the centre of the contact faces of the substrates and only two zones, which lie opposite one another in relation to the centre, are used for the fixing, a more uniform in particular linear course of the bonding wave can be produced. In the ideal case, there are precisely two bonding waves, one for each side.

It is particularly advantageous if the deformation, preferably curvature, of the first and/or second substrate and/or of the second substrate takes place in a convex and/or concave manner, still more preferably mirror-symmetrical. In other words, the deformation takes place according to the invention particularly by extension and/or compression and/or curvature of the first substrate and/or the second substrate.

The substrates preferably have approximately identical diameters D1, D2, which diverge from one another in particular by less than 5 mm, preferably less than 3 mm, still more preferably less than 1 mm.

According to a further, in particular independent, aspect of the invention, the deformation, preferably curvature, takes place by deformation means or curvature means and/or curvature changing means and/or by temperature control of the first and/or second holding devices.

In a further independent aspect of the invention, the holding device itself can be designed capable of being curved, similar to the embodiment in publication WO2014191033A1.

The deformation/curvature/change in curvature according to the invention can be achieved more easily by the fact that the first substrate and/or the second substrate is fixed solely in the region of the periphery or the circumference of the first and/or second substrate holder or of the first and/or second substrates.

The fixing takes place via zones, which are switched according to the conditions in order to obtain the desired symmetry of the deflection which minimises the "run-out" error, in particular at every position of the substrates bonded together.

The control of the previously described steps and/or movements and/or sequences, in particular of the deformation means or curvature means and/or curvature changing means and/or fixing means, the approach of the substrates towards one another, the temperature, pressure and gas composition control, preferably takes place via a central control unit, in particular a computer with control software. The sensors described above are used for the control and/or regulation.

The substrates are preferably fixed at a circle segment lying as far outward as possible, in the region of the side edge, in order to provide the substrates with the greatest possible flexibility and freedom of expansion inside the fixing.

The first and/or second substrate is preferably radially symmetrical. Although the substrate can have any diameter, the substrate diameter is in particular 1 inch, 2 inches, 3 inches, 4 inches, 5 inches, 6 inches, 8 inches, 12 inches, 18 inches or greater than 18 inches. The thickness of the first and/or second substrate lies between 1 µm and 2000 µm, preferably between 10 µm and 1500 µm, more preferably between 100 µm and 1000 µm.

In special embodiments, a substrate can also have a rectangular shape or a shape at least diverging from the circular shape. Wafers are preferably used as substrates.

Particularly preferably, all the variable parameters are selected such that the bonding wave propagates at the optimum possible speed with regard to the prevailing initial and boundary conditions. Particularly in the presence of atmosphere, in particular normal pressure, a speed of the bonding wave as slow as possible as advantageous. The average speed of the bonding wave is in particular less than 200 cm/s, more preferably less than 100 cm/s more preferably less than 50 cm/s, most preferably less than 10 cm/s, with utmost preference less than 1 cm/s. In particular, the speed of the bonding wave is greater than 0.1 cm/s. In particular, the speed of the bonding wave is constant along the bonding front. The speed of the bonding wave is automatically faster in a vacuum environment, since the substrates joining along the bonding line do not have to overcome any resistance due to a gas.

A further, in particular independent, aspect of the invention includes making contact in as coordinated a manner as possible and at the same time virtually automatically, whereby at least one of the substrates is acted upon before the contacting by preloading running radially outwards in particular concentrically with respect to centre M of the contact face of the substrate and then only the beginning of the contacting is influenced, whereas after contacting of a section, in particular centre M of the substrate, the substrate is left free and automatically bonds with the opposite substrate in a controlled manner by reason of its preloading.

The preloading is achieved by a deformation, in particular curvature, of the first substrate by deformation means, in particular curvature means and/or curvature changing means, wherein the deformation means, in particular by reason of its shape, acts on the side facing away from the bonding side and deformation can be correspondingly controlled by the use of different (in particular exchangeable) deformation means. The control also takes place through the pressure or the force with which deformation elements act on the substrate. It is advantageous to reduce the effective holding area of the substrate holder with the substrate, so that the substrate is supported only partially by the holding device. In this way, a smaller adhesion between the substrate and the substrate holder arises due to the smaller contact area. A fixing is applied according to the invention, in particular in the region of the periphery of the substrate, so that an effective fixing is provided with at the same time the smallest possible effective holding area between the holding contour of the substrate holder and the substrate. A careful and reliable release of the substrate is thus at the same time possible, since the release forces required for the release of the substrate are as small as possible. The release is in particular controllable, especially by reducing the underpressure at the holding surface. Controllable means that, after the contact of the substrate with a second substrate, the substrate still remains fixed to the sample holder and a release of the substrate (wafer) from the sample holder (holding device) is only brought about, in particular from the inside outwards, by a targeted (controlled) reduction of the underpressure at the holding surface. The effect of the embodiment according to the invention is in particular that the release can be brought about by very small forces. In particular, a plurality of different methods of release is disclosed.

- complete, sudden release of the substrate, while the deformation means is inactive,
- complete, sudden release of the substrate, while the deformation means is put spontaneously into its initial state and thus immediately ceases to act on the substrate,
- complete, sudden release of the substrate, while the deformation means ceases progressively, but continuously to act on the substrate,
- progressive release of the substrate, applied in particular zone by zone and preferably carried out from the inside outwards, by progressive switching-off of the fixings, while the deformation means is acting on the substrate,
- a combination of the stated methods The embodiment according to the invention discloses in its optimum form a bonding process, wherein the two substrates are curved. Generally speaking, however, at least one substrate may also not be deformed. The following table results in combination with the stated release mechanisms:

| Example # | Top deformed | Bottom deformed | Top Release | Bottom Release |
|---|---|---|---|---|
| 1 | No | Yes | No | Yes |
| 2 | No | Yes | Yes | No |
| 3 | Yes | Yes | No | Yes |
| 4 | Yes | Yes | Yes | No |
| 5 | Yes | No | No | Yes |
| 6 | Yes | No | Yes | No |

All the structures on the substrates can already be designed, calculated and produced in such a way that the methods and systems according to the invention produce an optimum compensation of the "run-out" error. It is for example conceivable for rectangular structures to be designed by a factor smaller in the direction in which the "run-out" error distorts the structure. This factor lies in particular between 0 and 3, preferably between 0 and 2, still more preferably between 0 and 1, most preferably between 0 and 0.1, with utmost preference between 0 and 0.001. If, for example, it is known from measurements and/or calculations that a "run-out" error leads, at a defined position of the substrates, to a distortion by the factor 1.021 in the x-direction, the structure is enlarged in the computer by this factor in the x-direction. A factor of 1 would thus leave a dimension of the structure undistorted. A factor of less than 1 would reduce the size of the structure in the specified dimension, a factor greater than 1 would correspondingly enlarge it. When the structure is then produced, it is larger by this factor in the x-direction.

Instead of the use of multiplicative factors, use can also be made of positive and negative summands in order to specify the change in the dimension of a direction of the substrate by addition or subtraction. An indication of value ranges will be dispensed with here.

It is also conceivable for the structures to be designed in the normal state in the computer, but for the production devices such as for example lithography systems to produce the structures scaled corresponding to the previously calculated and/or determined factors. The following in particular are mentioned as production devices:

Lithography system, in particular
photolithographic system, in particular
   stepper
imprint lithography system, in particular
   stepper
radiation lithography system, in particular
   electron beam lithography
   ion beam lithography
   laser lithography The methods and systems according to the invention in combination with a correct design and/or calculation and/or production process for the structures to be bonded thus lead to a further and optimised bond quality and therefore to still better results. If, therefore, an occurring "run-out" error can be calculated or measured, which can no longer be reduced by influencing the bonding wave by the methods and/or systems according to the invention, the above method can be used for its further reduction.

Features disclosed according to the device are deemed also to be disclosed as according to the method and vice versa.

Further advantages, features and details of the invention emerge from the following description of preferred examples of embodiment and with the aid of the drawings.

BRIEF DESCRIPTION OF THE DRAWINGS

FIG. 1a shows a diagrammatic partial view (not true to scale) of a first embodiment of a holding device according to the invention, FIG. 1b shows a diagrammatic partial view (not true to scale) of a second embodiment of the holding device according to the invention, FIG. 1c shows a diagrammatic partial view (not true to scale) of a third embodiment of the holding device according to the invention, FIG. 1d shows a diagrammatic partial view (not true to scale) of a fourth embodiment of the holding device according to the invention, FIG. 1e shows a diagrammatic partial view (not true to scale) of a first embodiment of a curvature (changing) means of the holding device according to the invention, FIG. 1f shows a diagrammatic partial view (not true to scale) of a second embodiment of a curvature (changing) means of the holding device according to the invention, FIG. 2a shows a diagrammatic view (not true to scale) of a fifth embodiment of a holding device according to the invention, FIG. 2b shows a diagrammatic view (not true to scale) of a sixth embodiment of a holding device according to the invention, FIG. 2c shows a diagrammatic view (not true to scale) of a seventh embodiment of a holding device according to the invention, FIG. 2d shows a diagrammatic view (not true to scale) of an eighth embodiment of a holding device according to the invention, FIG. 2e shows a diagrammatic view (not true to scale) of a ninth embodiment of a holding device according to the invention, FIG. 3a-3e show diagrammatic side views (not true to scale) and plan views of embodiments of an elevation according to the invention, FIG. 4c shows a diagrammatic cross-sectional view (not true to scale) of the embodiment according to FIG. 4a in a further process step, FIG. 4d shows a diagrammatic cross-sectional view (not true to scale) of the embodiment according to FIG. 4a in a further process step and FIG. 4e shows a diagrammatic cross-sectional view (not true to scale) of the embodiment according to FIG. 4a in a further process step.

FIG. 5a shows a diagrammatic view from below of an upper sample holder in a first fixing configuration, FIG. 5b shows another diagrammatic view from below of the upper sample holder in a second fixing configuration, FIG. 6a shows a diagrammatic plan view of two substrates in a non-ideal alignment, FIG. 6b shows a diagrammatic plan view of two substrates in a more ideal alignment, FIG. 7a shows a diagrammatic plan view of two substrates in a first vector field and FIG. 7b shows a diagrammatic plan view of two substrates in a second vector field.

DETAILED DESCRIPTION OF THE INVENTION

Figure 4A:
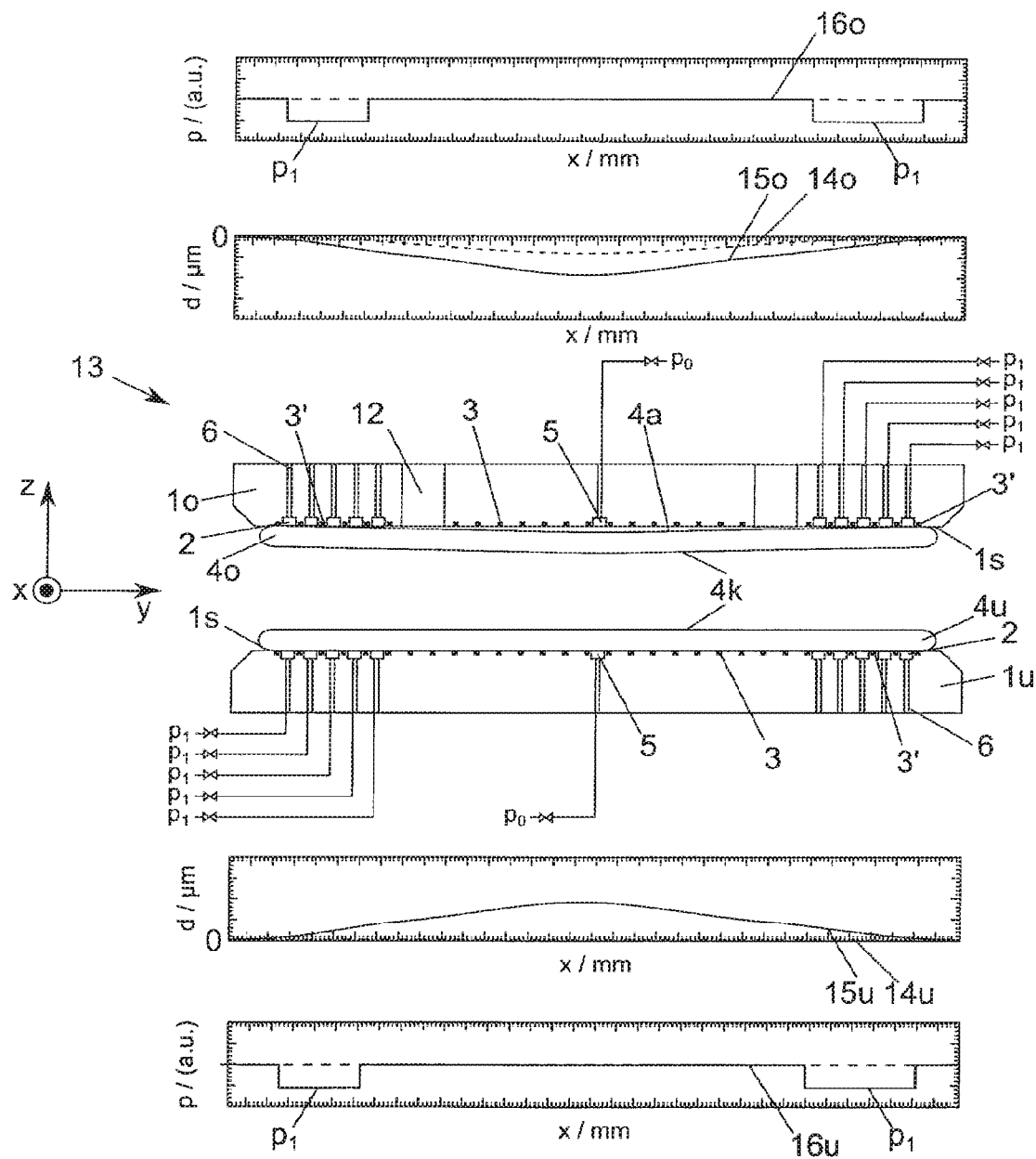
FIG. 4a shows a diagrammatic cross-sectional view (not true to scale) of an embodiment of a bonder according to the invention with pressure and distance diagrams in a first process step of a process according to the invention.

Identical components and components with the same function are marked with the same reference numbers in the figures.

The X-axis runs in holding surface $1s$, $1s'$, $1s''$, $1s'''$ of substrate holder $1o$ and $1u$. The Y-axis runs normal to the X-axis and also in holding surface $1s$, $1s'$, $1s''$, $1s'''$ of substrate holder $1o$ and $1u$. The Z-axis runs normal to the X- and Y-axis and normal to holding surface $1s$, $1s'$, $1s''$, $1s'''$ of substrate holder $1o$ and $1u$.

FIG. 1a shows a diagrammatic partial view (not true to scale) of a cross-section of a first embodiment of a holding device 1 according to the invention (referred to alternatively as a substrate holder), wherein only an edge region R with fixing elements 2 (fixing means) is represented.

Holding device 1 comprises a plurality of zones Zi, which are preferably located in edge region R. Each of zones Zi can comprise a plurality of fixing elements 2. By way of example, two zones Z1 and Z2 are represented in FIG. 1a. Four fixing elements 2 are shown in cross-section in first zone Z1, whereas two fixing elements 2 are shown in second zone Z2. In particular, zones Zi can be limited to edge region R of substrate holder 1 or be distributed over entire substrate holder 1.

Fixing elements 2 are used for the fixing of a substrate holding surface $4a$ of a first, in particular upper, substrate $1o$ or a second, in particular lower, substrate $1u$.

A plurality of sensors 3, 3', in particular distance sensors, are preferably located in holding surface $1s$. The sensors are used for the measurement of physical and/or chemical properties between fixed substrate 4 and holding surface $1s$. Sensors 3, 3' are in particular distance sensors, with the aid of which a distance between holding surface $1s$ and substrate holding surface $4a$ is measured.

Substrate holder 1 is preferably designed such that a curvature element 5, 5' (curvature means) is located in its centre C (see FIGS. 1e and 1f), with the aid of which a substrate $4o$, $4u$ fixed to substrate holder 1 can be curved. Particularly preferably, curvature element 5 is a fluid outlet opening, via which a gas, in particular compressed air, can be pumped between substrate holder 1 and substrate 4. Substrate 4 is curved by the excess pressure, while at the same time it is fixed by fixing elements 2 or released in a controlled manner.

In the alternative embodiment according to the invention according to FIG. 1f, curvature element 5' is a pin, which extends through holding device 1 and which is constituted displaceable normal to the latter (curvature means or curvature changing means).

The embodiments in respect of FIGS. 1e and 1f similarly apply to the embodiments according to FIGS. 1a to 1d.

A substrate holder 1' in a second embodiment according to the invention is shown in FIG. 1b. Substrate holder 1' comprises a plurality of zones Zi which are preferably located in edge region R. Each of zones Zi can in general comprise a plurality of fixing elements 2'. Fixing elements 2' are electrodes of an electrostatic fixing. Two zones Z1 and Z2 are represented by way of example in FIG. 1b. In first zone Z1, two fixing elements 2' can be seen in cross-section, whilst in second zone Z2 three fixing elements 2' can be seen in cross-section. In particular, zones Zi can be limited to the outer edge of substrate holder 1', or can be distributed over entire substrate holder 1'.

A plurality of sensors 3, 3', in particular distance sensors, are preferably located in holding surface $1s'$. Sensors 3, 3' are used for the measurement of physical and/or chemical properties between fixed substrate 4 and holding surface $1s'$. Sensors 3, 3' are in particular distance sensors, with the aid of which the distance between holding surface $1s'$ and substrate holding surface $4a$ is measured.

A substrate holder 1'' in a third embodiment according to the invention is disclosed in FIG. 1c. Substrate holder 1'' comprises a plurality of zones Zi, which are preferably located solely in edge region R. Each of zones Zi can in particular comprise a plurality of fixing elements 2''.

Fixing elements 2'' are spatial regions 9 between substrate holding surface $1a$, adjacent webs 8 or an edge element 10 and webs 8 and a bottom penetrated by lines 6. A pressure is adjusted in lines 6 in order to engage substrate 4o, 4u by suction and thus to fix the latter.

A plurality of studs 7, on which substrate 4o, 4u lies, are in particular located in spatial region 9. Studs 7 are used in particular to prevent excessive contamination. Studs 7 have been represented above average size in FIG. 1c in order to improve the view. In reality, studs 7 are much smaller compared to the thickness of substrate holder 1".

Two zones Z1 and Z2 are represented by way of example in FIG. 1c. Three fixing elements 2" can be seen in cross-section in first zone Z1, whilst three fixing elements 2" can likewise be seen in cross-section in second zone Z2. In particular, zones Zi can be limited to the outer edge of substrate holder 1" or be distributed over entire substrate holder 1".

A plurality of sensors 3, 3', in particular distance sensors, are preferably located in studs 7, in particular at a stud surface 7o of studs 7 that contacts substrate holding surface 1a in the non-curved state. The sensors are used to measure physical and/or chemical properties between fixed substrate 4 and holding surface 1s defined by stud surface 7o and peripheral edge element 10. Sensors 3, 3' are in particular distance sensors, with the aid of which the distance between stud surface 7o and substrate surface 4o is measured.

FIG. 1d shows a substrate holder 1''' in a fourth embodiment according to the invention. Substrate holder 1''' comprises in particular a plurality of zones Zi which are preferably located in edge region R. Each of zones Zi can comprise a plurality of fixing elements 2'''.

Fixing elements 2''' are spatial regions 9 between two adjacent lines 6, in which a pressure can be adjusted. A limitation of spatial regions 9 takes place only at the periphery of holding device 1''' by a peripheral edge element 10, on which substrate 1o, 1u lies at the circumference and which together with stud surface 7o defines a holding surface 1s'''.

A plurality of studs 7 is located in particular in spatial region 9, on stud surface 7o whereof a substrate 4o, 4u can be held. Studs 7 are used in particular to prevent excessive contamination. Studs 7 have been represented above average size in FIG. 1c in order to improve the view. In reality, the studs are much smaller compared to the thickness of substrate holder 1'''.

Two zones Z1 and Z2 are represented by way of example in FIG. 1d. A fixing element 2''' can be seen in cross-section in first zone Z1, a fixing element 2''' likewise being present in cross-section in second zone Z2. In particular, zones Zi can be limited to the outer edge of substrate holder 1''' or can be distributed over entire substrate holder 1'''.

A plurality of sensors 3, 3', in particular distance sensors, are preferably located on a bottom of spatial regions 9 between studs 7. Sensors 3, 3' are used to measure physical and/or chemical properties between fixed substrate 4 and the bottom. Sensors 3, 3' are in particular distance sensors, with the aid of which the distance between the bottom and substrate holding surface 4a is measured. The distance of substrate holding surface 1a from stud surface 7o can be calculated therefrom via the known height of studs 7.

FIG. 2a shows a holding device $1^{IV}$, wherein fixing elements 2 are arranged in four concentric zones Z1-Z4. A curvature element 5, 5' is located at centre C of holding device $1^{IV}$ (see FIG. 1e or 1f). Corresponding fixing elements 2 of a plurality of zones are each arranged along radially running lines L.

FIG. 2b shows a holding device $1^V$, wherein fixing elements 2 are arranged in four zones Z1-Z4. A curvature element 5, 5' is located in the centre of holding device $1^V$ (see FIG. 1e or 1f). Corresponding fixing elements 2 of a plurality of zones are each arranged along a line L', which does not run through curvature element 5, in particular not through centre C. In particular, line L' does not have to be a straight line. Corresponding fixing elements 2 lying opposite in each case are arranged point-mirrored with respect to centre C.

FIG. 2c shows a holding device $1^{VI}$ with a plurality of studs 7, surrounded by an edge element 10 similar to the embodiment according to FIG. 1c. Spatial regions 9 are located between studs 7, said spatial regions acting as fixing elements $2^{IV}$ during an evacuation. The evacuation takes place via lines 6. Since no webs 8, which separate spatial regions 9 from one another, are present in this embodiment according to the invention, a fluid introduced via a curvature element 5 (see FIG. 1e) is removed again by suction directly via channels 6. This embodiment according to the invention is therefore an example of a substrate holder, wherein a stationary laminar flow is built up between substrate holder $1^{VI}$ and substrate 4o, 4u.

FIG. 2d shows an embodiment according to the invention, wherein a plurality of zones Z are provided with a plurality of fixing elements 2. Zones Z are located at the periphery of the sample holder $1^{VII}$ and can fix a substrate 4 at maximum position 6. By means of the fixing of a substrate 4o over zones Z1, Z3 and Z5, a substrate can for example experience a more or less triangular deflection due to gravitation. Similar considerations apply to the switching of zones into a rectangular or other arrangement.

FIG. 2e shows an embodiment according to the invention, wherein fixing elements 2 are arranged along a spiral. In this case, entire holding surface 1s represents single zone Z. The individual or grouped triggering of the fixing elements is conceivable. Curvature element 5, 5' is arranged at the end of the spiral and in centre C.

All the embodiments according to FIGS. 2a-2e are holding devices wherein the fixings are constituted as underpressure or vacuum fixings. Corresponding substrate holders with electrostatic fixing can similarly be implemented. For the sake of a clearer view, sensors 3, 3' have not been represented, but can be constituted corresponding to the embodiments according to FIGS. 1a to 1d.

FIGS. 3a-3e show examples of embodiment of shapes of elevations 7, 7', 7'', 7''', 7''''. The shape according to FIG. 3a comprises a cylindrical base body with a round head. The shape according to FIG. 3b comprises a cylindrical base body with a flat head. The shape according to FIG. 3c comprises a hemispherical base body. The shape according to FIG. 3d comprises a three-sided pyramid. The shape according to FIG. 3e comprises a four-sided pyramid.

In the following descriptions of figures, a bonding process according to the invention is represented by way of example, wherein a uniaxial curvature of substrate 4o and 4u takes place with the aid of a curvature means 5.

FIG. 4a shows a bonder 13 according to the invention for the contacting and bonding of contact faces 4k of a first/upper substrate 4o and a second/lower substrate 4u, said contact faces being arranged opposite one another. Bonder 13 comprises a lower substrate holder 1u and an upper substrate holder 1o. Substrate holders 1u, 1o can in particular be constituted as above-described holding devices 1, 1', 1'', 1''', $1^{IV}$, $1^V$, $1^{VI}$ for holding a first/upper substrate 4o and a second/lower substrate 4u, wherein lower substrate holder 1u can be constituted or equipped differently from upper substrate holder 1o.

Upper substrate holder 1o preferably comprises measurement holes 12, through which a measurement of substrate 4o can take place from a rear side of substrate holder 1o. Alternatively, sensors can be arranged in the measurement holes. Measurement holes 12 are arranged in particular between the curvature changing means and the fixing means. Alternatively or in addition, lower substrate holder 1u can comprise corresponding measurement holes 12. The measurement holes penetrate holding device 1 and run in particular orthogonal to holding surface 1s. Measurement holes 12 are preferably arranged at a distance of 180° or 120° from one another.

Substrate holders 1u, 1o comprise a holding surface 1s, with a plurality of fixing elements 2 and sensors 3, 3'. Fixing elements 2 are evacuated via lines 6 and fix substrates 4u, 4o. Diagrams are shown above and below substrate holders 1u, 1o, which diagrams show in each case distances d between sensors 3 constituted as distance sensors and substrate 4u, 4o along the x-direction (substrate diameter) for the given x-positions. The distance sensors are arranged directly at curvature changing means 5 distributed up to the fixing means. They thus extend over a partial area of holding surface 1s.

Sensors 3' constituted as pressure sensors are arranged in the region of the fixing means, with which sensors pressures pi are measured along the x-position of sensors 3' between substrates 4u, 4o and substrate holders 1u, 1o.

Desired setpoint curvatures 15u, 15o, in particular set by means of software, as well as actual curvatures 14u, 14o measured by the distance sensors are entered in the distance diagrams. Upper substrate 4o has an actual curvature 14o, in particular present due to gravitation, while lower substrate 1u lies flat and therefore, in the sense of the present invention, does not have an actual curvature 14u (in reality, a vanishingly small one). It is however also conceivable that actual curvature 14o caused by gravitation is negligibly small. Both desired curvatures 15u, 15o are mirror-symmetrical in the stated example. Arbitrarily curvatures 15u, 15o can be specified. Pressure courses 16u and 16o show a pressure drop in the region of activated fixing elements 2. This shows that the fixing of substrates 4u, 4o is activated.

A process step of the alignment of the two substrates 1u, 1o with respect to one another is not represented.

Figure 4B:
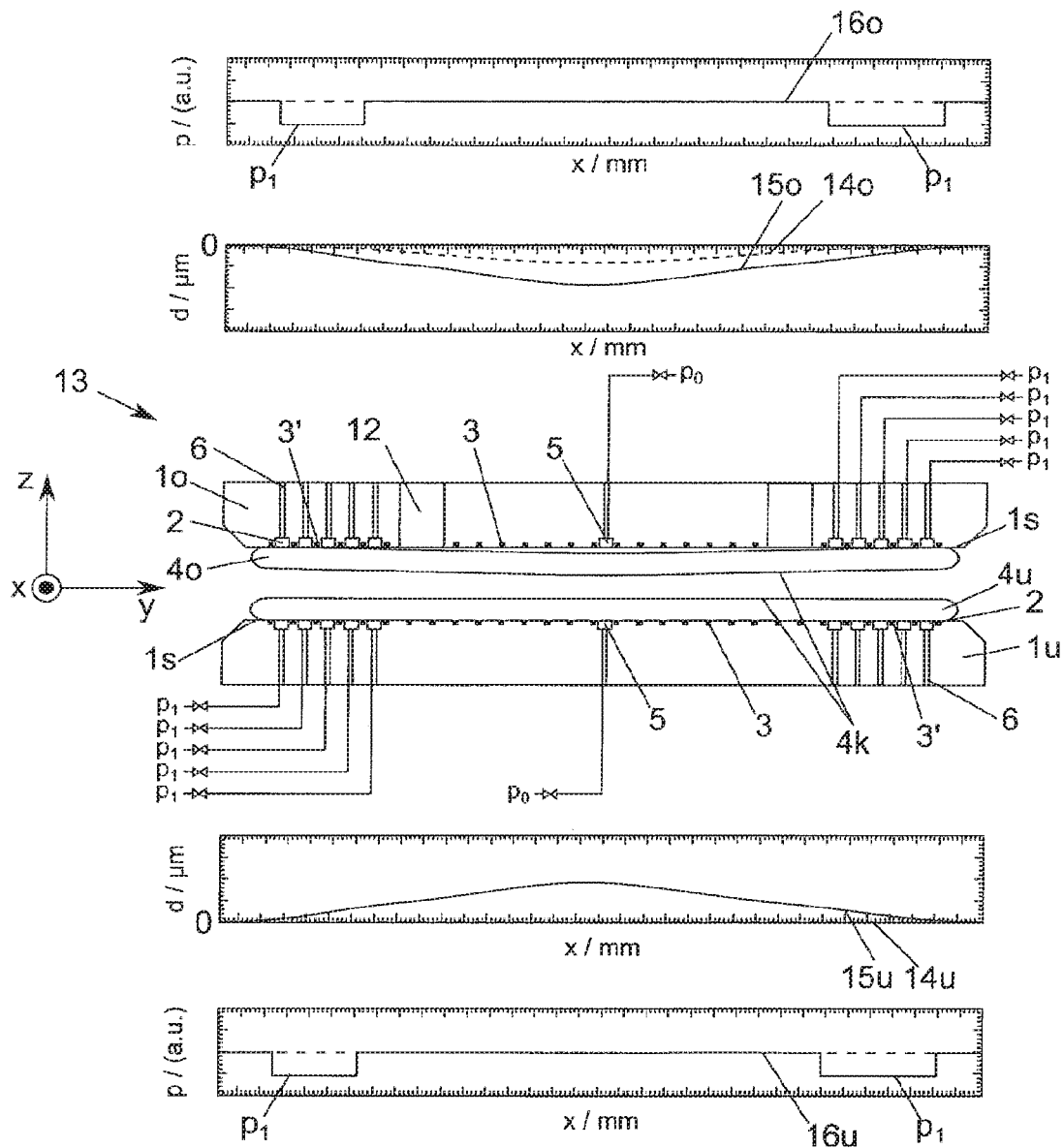
FIG. 4b shows a diagrammatic cross-sectional view (not true to scale) of the embodiment according to FIG. 4a in a further process step.

FIG. 4b shows bonder 13 in a further process step. The two substrate 4u and 4o have been brought close together by a relative movement of the two substrate holders 1u, 1o. Otherwise nothing has changed compared to the situation according to FIG. 4a.

FIG. 4c shows bonder 13 in a further process step. The two substrates 1u, 1o are brought into the setpoint curvature by the use of curvature elements 5, in the case shown a gas outlet opening, through which a gas flows with a pressure p2, wherein a control of the pressure preferably takes place by means of the distance sensors. The pressures of fixing elements 2 can also be used for the control/regulation, so that the latter also take over the tasks of curvature means 5, 5' or curvature changing means 5, 5' and, within the meaning of the invention, can thus also be included in the latter.

In the example shown, one of fixing elements 2" is reset for this purpose from pressure p1 to pressure p0 to achieve the desired curvature before contacting of substrates 4o, 4u. For the sake of simplicity, only three pressure values p0, p1 and p2 are shown in the shown representations. The pressure values can be controlled/regulated in particular continuously and/or constantly.

FIG. 4d shows bonder 13 in a further process step. The two substrates 4u, 4o, as a result of the mutual approach of substrates 4u, 4o, form a bonding wave which propagates radially outwards, wherein the curvature of substrates 4u, 4o changes continuously (curvatures changing means). The change in curvature of lower substrate 1u and of upper substrate 1o is continuously monitored by means of the distance sensors and, if need be, corrected by curvature element 5 and/or fixing elements 2, in such a way that the setpoint curvature desired or set in each case is achieved (curvature changing means). Curvature radii R1 of upper substrate 4o and R2 of lower substrate 4u represent important parameters at the point of the bonding wave.

The pressures of four inner peripheral rows of fixing elements 2 are simultaneously reduced to p0 in the case of upper holding device 1o and lower holding device 1u. Substrates 1u, 1o thus lose the fixing to holding surface 1o, in particular continuously from inside outwards, as a result whereof pressure p2 from curvature element 5 can spread further.

As a result of the fact that the control takes account of the curvatures and changes in curvature of the substrates, run-out errors are minimised.

FIG. 4e shows bonder 13 in a further process step. The two substrates 1u, 1o have been bonded together in a controlled manner, whereby the pressure of the outermost row of fixing elements 2 of upper holding device 1o has been reduced to p0.

FIG. 5a shows a view from below of an upper sample holder 1o with a fixed substrate 4o, which is completely fixed. The X-axis runs in holding surface 1s, 1s', 1s", 1s''' of substrate holder 1o. The Y-axis runs normal to the X-axis and also in holding surface 1s, 1s', 1s", 1s''' of substrate holder 1o. The Z-axis runs normal to the X- and Y-axis and also normal to holding surface 1s, 1s', 1s", 1s''' of substrate holder 1o.

FIG. 5b also shows a view from below of upper sample holder 1o with a partially fixed substrate 4o, i.e. from the timing standpoint after the representation of FIG. 5a. The fixing means in the centre have been deactivated along contacting axis X or X-axis from the centre of substrate 4o up to the outer edge of substrate 4o, so that substrate 4o is deflected along the X-axis. The other fixing elements remain activated. The deflection of substrate 4o is represented not true to scale, in particular enlarged, in order to increase the clarity.

The "run-out" error, represented by the length of an arrow, is shown in an exaggerated manner in FIGS. 6a and 6b in order to enhance the clarity.

FIG. 6a shows an upper structure 17o of a substrate surface 4k of an upper substrate 4o and a lower structure 17u of a substrate surface 4k of a lower substrate 4u in plan view, after the two substrates 4o, 4u have been joined together employing a method according to the prior art. The generally multidimensional "run-out" error can clearly be seen, which is represented by the arrow in the x- and y-direction.

Particularly preferably, the uniaxial nature of the distortion vectors can be used in the design of the chip structures on the wafer. Structures 17u, 17o, e.g. contact pads, are designed such that, in the direction in which the smaller distortions occur, they are planned smaller and/or with a smaller spacing, since a better overlap of the pads after the bonding process is to be expected here due to the smaller distortions. Particularly preferably, distortions in the direction in which the distortions are larger can also be taken into account already at the stage of the chip layout. This enables a better overlap of the structures after the bonding also in this direction. As a result of the predominantly uniaxial nature of the distortions, this is possible with better accuracy and lower and therefore acceptable outlay compared to the prior art.

FIG. 6*b* shows an upper structure 17*o* of a substrate surface 4*k* of an upper substrate 4*o* and a lower structure 17*u* of a substrate surface 4*k* of a lower substrate 4*u* in plan view, after the two substrates 4*o*, 4*u* have been joined together with the method according to the invention. The generally mono-dimensional "run-out" error can clearly be seen, which is represented by the arrow in the y-direction. FIG. 6*b* indicates representatively that the "run-out" error has completely disappeared at least in the x-direction. A generally much smaller "run-out" error than in FIG. 6*a*, also in this case in the x-direction, will exist in practice. The structure still exhibits a, in particular, very small "run-out" error in the y-direction. The overlap has however at all events improved. It can be roughly estimated in the case of a square structure 17*u*, 17*o* that the absolute length of the distortion vector will fall by the factor 1.41 (root of 2). As a rule, structures 17*u*, 17*o* are often rectangular, i.e. length and width are different. Advantageously, structures 17*u*, 17*o* can be orientated in such a way that the broad side of structures 17*u*, 17*o* runs parallel to the direction in which the greatest (in particular uniaxial) distortion is expected. The distortion vectors to be expected over such structures 17*u*, 17*o* can thus be minimised. Furthermore, the positioning of structures 17*u*, 17*o* on the substrate can be designed such that the distortion is already taken account during the layout. Advantageously, the positioning of structures 17*u*, 17*o* is designed such that the overlap error resulting from the distortion at the midpoint position of the broad side of structures 17*u*, 17*o* disappears and has a positive sign on one side of the midpoint of the distortion error factor and a negative sign on the other side.

FIG. 7*a* shows a vector field chart of a substrate stack comprising substrates 4*o*, 4*u*, the vectors whereof represent the "run-out" error. A radially symmetrical symmetry can be seen, with an increasingly large "run-out" error from the centre to the edge.

FIG. 7*b* shows a vector field chart of a substrate stack comprising substrates 4*o*, 4*u*, the vectors whereof represent the "run-out" error. A uniaxial symmetry can be seen, with an increasingly large "run-out" error from the centre to the edge. As a result of the method of uniaxial bending of the substrates according to the invention, the "run-out" error can be made negligibly small at least along the x-axis. In the ideal case, the "run-out" error even becomes negligibly small along the y-axis. A representation of a substrate stack with a vanishingly small "run-out" error in all directions has however been dispensed with in a further figure, since no new information can be acquired from such a figure.

LIST OF REFERENCE NUMBERS 1, 1' 1", 1''' holding device/substrate holder
$1^{IV}$, $1^V$, $1^{VI}$, $1^{VII}$ holding device/substrate holder
1*o* first holding device/upper substrate holder
1*u* second holding device/lower substrate holder
1*s*, 1*s*', 1*s*", 1*s*''' holding surface
2, 2', 2", 2''' fixing elements
20''' fixing element surface
3, 3' sensors
4*o* first/upper substrate
4*u* second/lower substrate
4*a* substrate holding surface
5, 5' deformation element/curvature element
6 line
7, 7', 7", 7''', 7'''' elevations/studs
7*o* stud surface
8 web
9 spatial region
10 edge element
11 stud plane
12 measurement holes
13 bonder
14*u*, 14*o* actual curvature
15*u*, 15*o* setpoint curvature
16*u*, 16*o* pressure course
17*u*, 17*o* structures
L, L' line
x position
d distance
p pressure
R1, R2 radius of curvature
X contacting axis
Y, Z axis
Z1-Z6 zone Having described the invention, the following is claimed:

1. A method for bonding a first substrate with a second substrate at respective mutually facing contact faces of the first and second substrates, the method comprising:
    holding the first substrate to a first holding surface of a first holding device having a plurality of fixing elements, and holding the second substrate to a second holding surface of a second holding device having a plurality of fixing elements,
    respectively fixing the first and second substrates to the first and second holding surfaces by switching on the plurality of fixing elements of the first and second holding devices, and
    curving at least one of the contact faces of the first and second substrates before contacting of the contact faces of the first and second substrates,
    wherein after the contacting of the contact faces of the first and second substrates, switching off each fixing element that is arranged uniaxially along a single contacting axis of at least one of the first or second holding devices, and keeping switched on the remaining fixing elements of the at least one of the first or second holding devices, so that the first and second substrates are first joined together only uniaxially along the contacting axis, and
    wherein the remaining fixing elements of the at least one of the first or second holding devices are thereafter switched off, so that the first and second substrates are joined together over a whole area.

2. The method according to claim 1, wherein the plurality of fixing elements of the first and second holding devices are arranged in a grid shape.

3. The method according to claim 1, wherein the plurality of fixing elements of the first and second holding devices are switched off sequentially.

4. The method according to claim 1, wherein the plurality of fixing elements of the first and second holding devices are switched off simultaneously along a curve.

5. The method according to claim 1, wherein the curvature is generated by a deformation element constituted in an elongated manner along the contacting axis and/or a plurality of deformation elements arranged along the contacting axis.

6. The method according to claim 1, wherein the curvature takes place in a convex manner as viewed from an opposite one of the first and second substrates.

7. The method according to claim 1, wherein the curvatures of both the first and second substrates take place mirror-inverted with respect to one another.

8. The method according to claim 1, wherein the contacting axis runs through a center of at least one of the first and second substrates.

9. The method according to claim 1, wherein the contacting of the respective contact faces of the first and second substrates is initiated at centers of the first and second substrates.

10. The method according to claim 1, wherein the fixing of the first and second substrates to the first and second holding surfaces takes place solely at respective outer edges of the first and second substrates.

11. The method according to claim 1, wherein the plurality of fixing elements of the first and second holding devices are grouped into a plurality of zones, wherein the plurality of zones are switchable on and off separately and/or are arranged at respective outer edges of the first and second substrates.

12. A device for bonding a first substrate with a second substrate at respective mutually facing contact faces of the first and second substrates, the device comprising:
- a first holding device for holding the first substrate to a first holding surface, said first holding device having a plurality of fixing elements, and a second holding device for holding the second substrate to a second holding surface, said second holding device having a plurality of fixing elements switchable between on and off,
- a curving device for curving at least one of the contact faces of the first and second substrates before contacting of the contact faces of the first and second substrates, and
- a controller operable such that after the contacting of the contact faces of the first and second substrates, switching off each fixing element that is arranged uniaxially along a single contacting axis of at least one of the first or second holding devices, and keeping the remaining fixing elements of the at least one of the first or second holding devices switched on, so that the first and second substrates can first be joined together only uniaxially along the contacting axis,
- wherein the controller is operable to switch off the remaining fixing elements of the at least one of the first or second holding devices thereafter, so that the first and second substrates are joined together over a whole area.

13. The method according to claim 2, wherein the plurality of fixing elements of the first and second holding devices are arranged with a constant distance between adjacent fixing elements.

14. The method according to claim 3, wherein the plurality of fixing elements of the first and second holding devices are switched off sequentially in a direction from inside toward outwards and/or at a same interval of time.

15. The method according to claim 9, wherein the contacting of the respective contact faces of the first and second substrates take place along the contacting axis completely up to respective outer edges of the first and second substrates.

16. The method according to claim 11, wherein the plurality of zones are arranged at the respective outer edges of the first and second substrates, the plurality of zones distributed with a uniform spacing from one another.

* * * * *